United States Patent
Scott et al.

(10) Patent No.: US 12,155,353 B2
(45) Date of Patent: Nov. 26, 2024

(54) POWER AMPLIFIER WITH PROTECTION LOOPS

(71) Applicant: Qorvo US, Inc., Greensboro, NC (US)

(72) Inventors: Baker Scott, San Jose, CA (US); Chong Woo, Fremont, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 498 days.

(21) Appl. No.: 17/488,877

(22) Filed: Sep. 29, 2021

(65) Prior Publication Data
US 2023/0096011 A1 Mar. 30, 2023

(51) Int. Cl.
H03F 1/52 (2006.01)
H03F 1/02 (2006.01)
(Continued)

(52) U.S. Cl.
CPC ............ H03F 1/52 (2013.01); H03F 1/0222 (2013.01); H03F 3/195 (2013.01); H03F 3/245 (2013.01);
(Continued)

(58) Field of Classification Search
CPC .......... H03F 1/52; H03F 1/0222; H03F 3/195; H03F 3/245; H03F 2200/105; H03F 2200/447; H03F 2200/451; H03F 2200/462; H03F 2200/468; H03F 2200/408; H03F 2200/411; H03F 3/19; H03F 2200/465; H03F 1/0238
(Continued)

(56) References Cited

U.S. PATENT DOCUMENTS 3,641,451 A 2/1972 Hollingsworth et al.
4,122,400 A 10/1978 Medendorp et al.
(Continued)

FOREIGN PATENT DOCUMENTS

CN 112803901 A 5/2021
EP 3651357 A1 5/2020
(Continued)

OTHER PUBLICATIONS

Written Opinion for International Patent Application No. PCT/US2022/044114, mailed Oct. 30, 2023, 21 pages.
(Continued)

*Primary Examiner* — Andrea Lindgren Baltzell
*Assistant Examiner* — Jose E Pinero
(74) *Attorney, Agent, or Firm* — Withrow & Terranova, P.L.L.C.

(57) ABSTRACT

A power amplifier includes an over-current protection loop and/or an over-voltage protection loop to assist in preventing operation outside a safe operation zone. In a further exemplary aspect, triggering of the over-current protection loop adjusts a threshold voltage for the over-voltage protection loop. In further exemplary aspects, the over-current protection loop may adjust not only a bias regulator, but also provide an auxiliary control signal that further limits signals reaching the power amplifier. In still further exemplary aspects, the over-voltage protection loop may operate independently of the over-current protection current loop or the over-voltage protection loop contribute to an over-current protection signal.

17 Claims, 28 Drawing Sheets

(51) Int. Cl.
*H03F 3/195* (2006.01)
*H03F 3/24* (2006.01)

(52) U.S. Cl.
CPC .. *H03F 2200/105* (2013.01); *H03F 2200/447* (2013.01); *H03F 2200/451* (2013.01); *H03F 2200/462* (2013.01); *H03F 2200/468* (2013.01)

(58) Field of Classification Search
USPC ........................................................ 330/127
See application file for complete search history.

(56) References Cited

U.S. PATENT DOCUMENTS

| | | | |
|---|---|---|---|
| 5,847,610 | A | 12/1998 | Fujita |
| 8,344,806 | B1 | 1/2013 | Franck et al. |
| 10,027,287 | B1* | 7/2018 | Ichitsubo .................. H03F 3/72 |
| 11,728,773 | B2 | 8/2023 | Gebeyehu et al. |
| 11,799,327 | B2 | 10/2023 | Marr, Jr. et al. |
| 2002/0125945 | A1* | 9/2002 | Taylor .................. H03G 3/3042 330/207 P |
| 2004/0239428 | A1 | 12/2004 | Apel |
| 2015/0015339 | A1 | 1/2015 | Gorbachov et al. |
| 2017/0126184 | A1* | 5/2017 | Oh ...................... H03F 3/45085 |
| 2019/0036495 | A1 | 1/2019 | Ng et al. |
| 2019/0068137 | A1 | 2/2019 | Wang |
| 2019/0363681 | A1 | 11/2019 | Saegusa |
| 2021/0211108 | A1 | 7/2021 | Khlat |
| 2021/0226589 | A1* | 7/2021 | Han ........................ H03F 3/245 |
| 2021/0281228 | A1 | 9/2021 | Khlat |
| 2021/0399691 | A1 | 12/2021 | Saminathan et al. |
| 2023/0094883 | A1 | 3/2023 | Scott et al. |

FOREIGN PATENT DOCUMENTS

| | | |
|---|---|---|
| EP | 3843264 A1 | 6/2021 |
| FR | 3107410 A1 | 8/2021 |
| WO | 9419870 A1 | 9/1994 |
| WO | 9531035 A1 | 11/1995 |
| WO | 2008030534 A2 | 3/2008 |
| WO | 2013099077 A1 | 7/2013 |

OTHER PUBLICATIONS

International Preliminary Report on Patentability for International Patent Application No. PCT/US2022/044114, mailed Dec. 22, 2023, 19 pages.
Extended European Search Report for European Patent Application No. 23171644.0, mailed Oct. 27, 2023, 14 pages.
Van Bezooijen, A. et al., "Over-Temperature Protection by Adaptive Output Power Control," Proceedings of the 9th European Conference on Wireless Technology, Sep. 2006, Manchester, UK, pp. 350-352.
International Search Report and Written Opinion for International Patent Application No. PCT/US2022/044114, mailed Jan. 11, 2023, 18 pages.
International Search Report and Written Opinion for International Patent Application No. PCT/US2022/044040, mailed Jan. 17, 2023, 17 pages.
International Search Report and Written Opinion for International Patent Application No. PCT/US2023/013683, mailed Jun. 9, 2023, 16 pages.
Extended European Search Report for European Patent Application No. 23155394.2, mailed Jul. 6, 2023, 12 pages.
Non-Final Office Action for U.S. Appl. No. 17/488,823, mailed Mar. 7, 2024, 9 pages.
Notice of Allowance for U.S. Appl. No. 17/488,823, mailed Aug. 21, 2024, 8 pages.

* cited by examiner

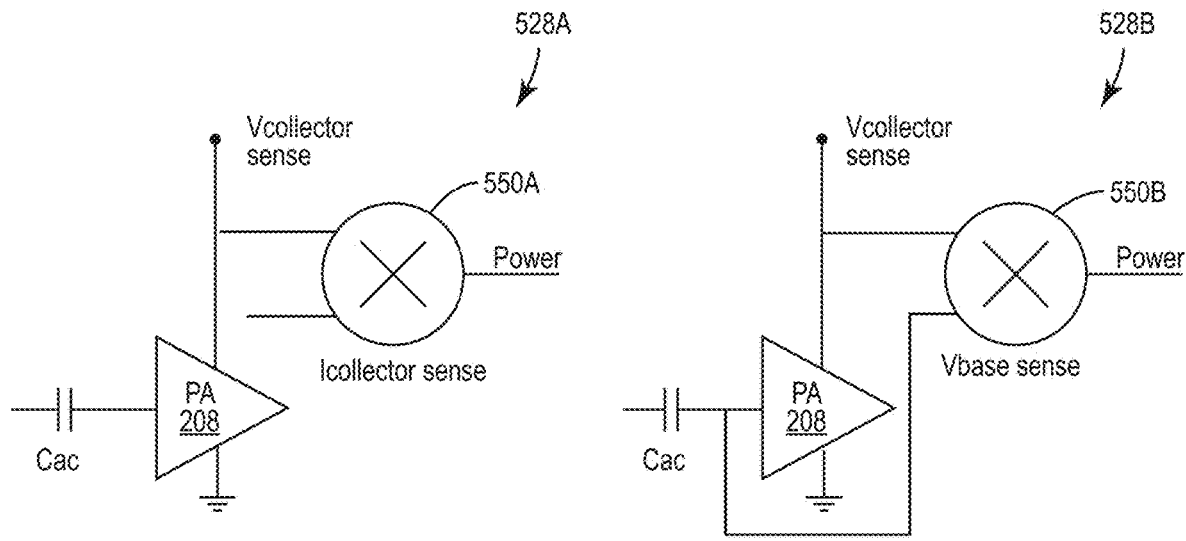
*FIG. 20A*
*FIG. 20B*
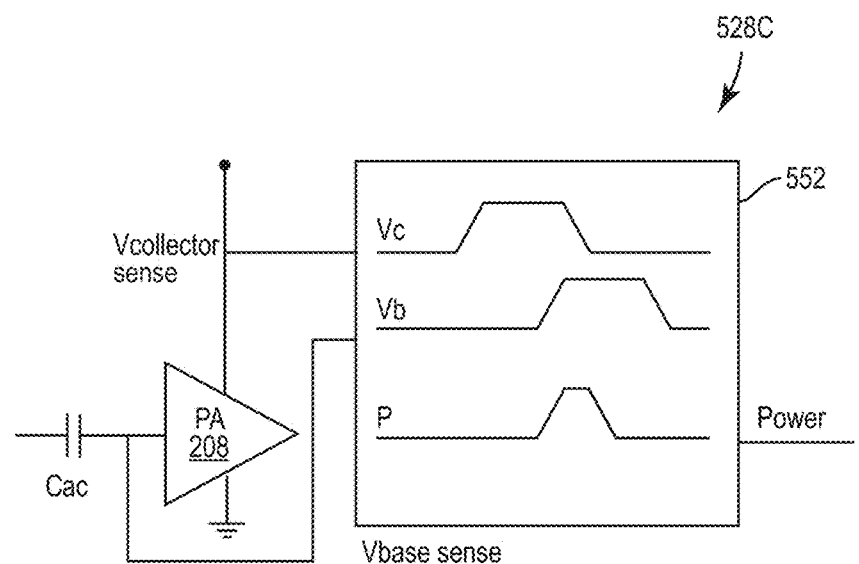
*FIG. 20C*

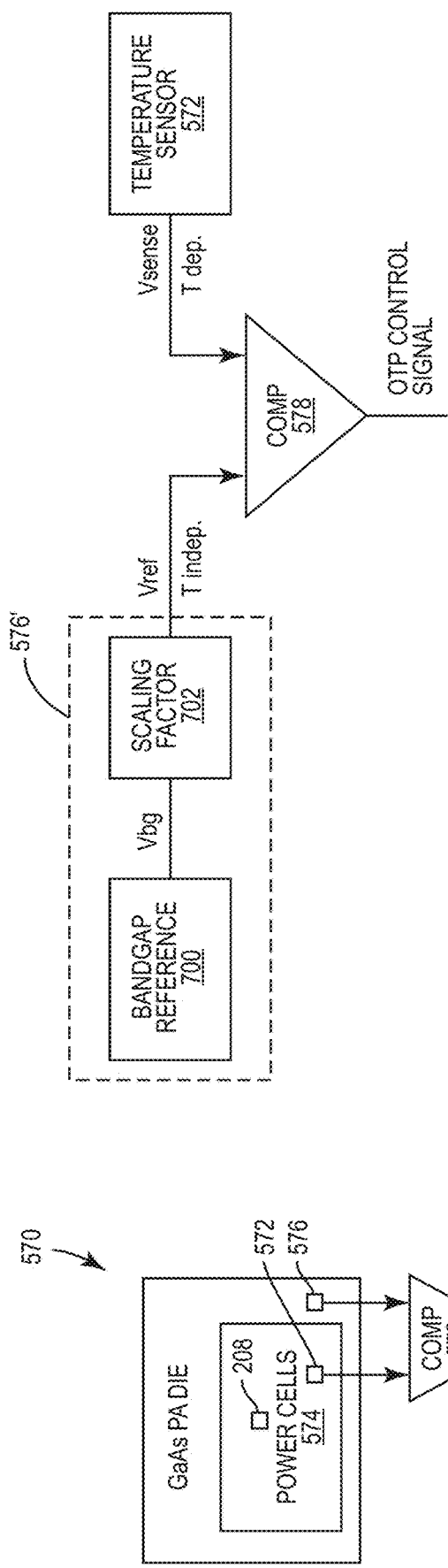
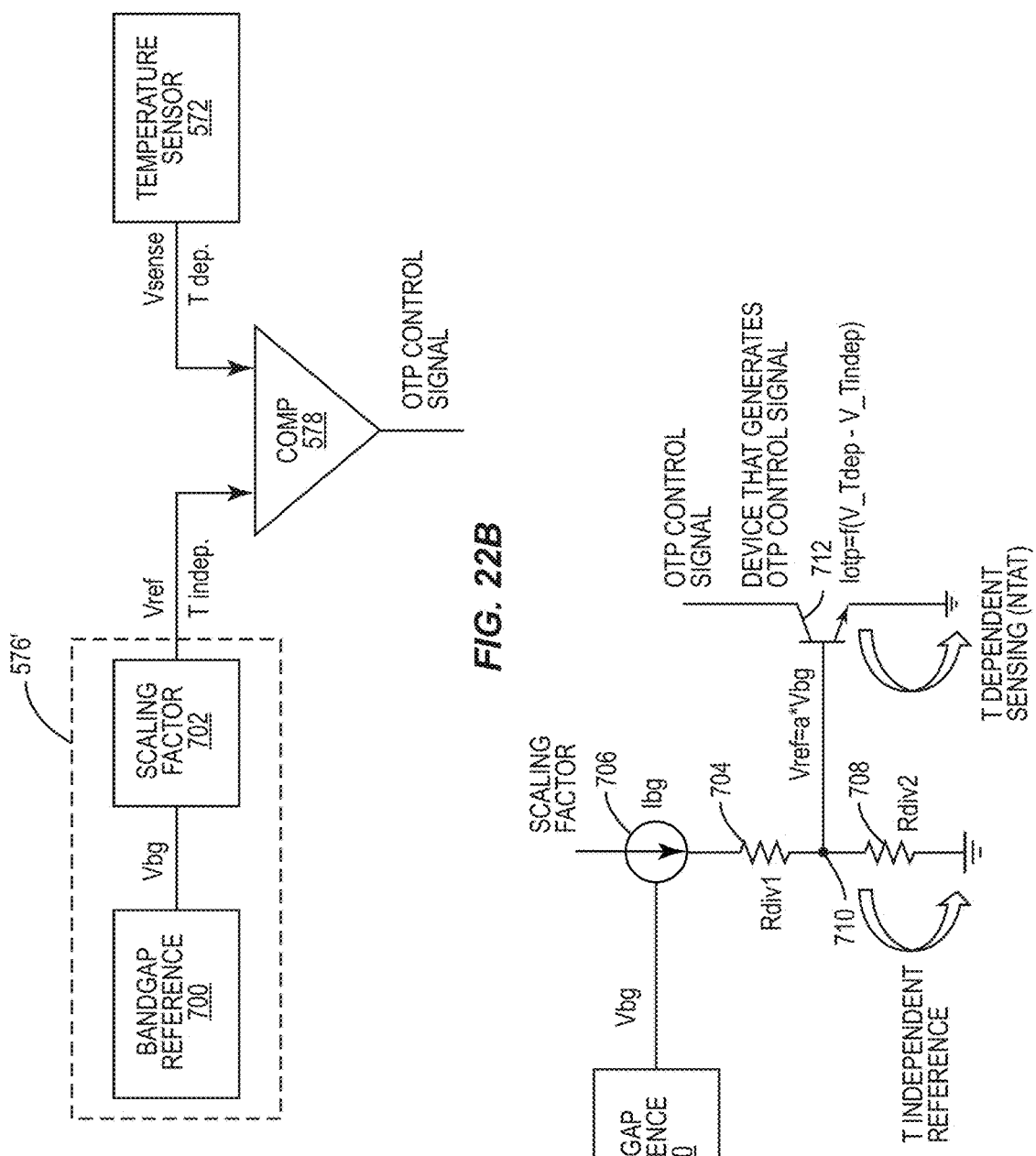
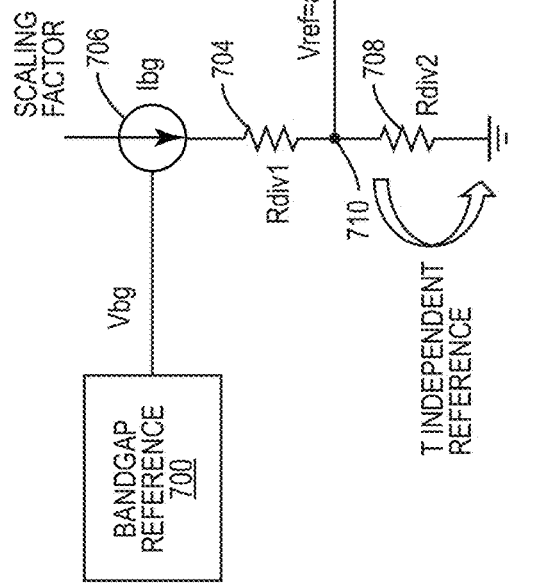
FIG. 22A
FIG. 22B
FIG. 22C

POWER AMPLIFIER WITH PROTECTION LOOPS

FIELD OF THE DISCLOSURE

The technology of the disclosure relates generally to a power amplifier circuit that operates in rugged conditions such as over-power situations and/or over-temperature situations.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Most mobile communication devices include a transmission chain which includes a power amplifier, power amplifier array, or series of staged power amplifiers that boost signals before transmission through an antenna. While the power amplifiers used in such situations are designed to operate over a wide range of conditions, end users, either innocently, or by design, frequently find ways to stress the power amplifiers beyond the intended operational range. When a power amplifier is subjected to conditions beyond its design tolerances, the power amplifier may fail, resulting in a failure or diminished functionality of the transmission chain with a corresponding loss of functionality for the mobile communication device.

Recognizing this possibility, some manufacturers of mobile communication devices have announced vigorous requirements for power amplifiers. Meeting these vigorous requirements presents opportunities for new solutions.

SUMMARY

Embodiments of the disclosure relate to a power amplifier with protection loops. Specifically, exemplary aspects contemplate providing an over-power protection loop and/or an over-temperature protection loop to assist in preventing operation outside a safe operation zone. These protection loops may operate independently of one another and other protection loops or may be coupled to other protection loops such as an overcurrent protection loop or an overvoltage protection loop. When over-power or over-temperature conditions are detected, a signal may be generated that throttles input(s) to the power amplifier, which, in turn, reduces the chance that the power amplifier will operate outside a safe operating area of the power amplifier, thereby satisfying the testing criteria of the mobile communication device manufacturers and likely extending the life cycle of the power amplifier.

In one aspect, a power amplifier circuit is disclosed. The power amplifier circuit includes a power amplifier. The power amplifier includes an output stage configured to provide an amplified output signal. The power amplifier circuit also includes a power detector circuit coupled to the power amplifier. The power detector circuit is configured to provide an overpower protection signal to a circuit that uses the overpower protection signal to control a bias signal for the output stage.

In another aspect, a power amplifier circuit is disclosed. The power amplifier circuit includes a power amplifier comprising an output stage configured to provide an amplified output signal. The power amplifier circuit further includes an overtemperature detection circuit configured to provide an overtemperature protection signal to a bias regulator circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 6:
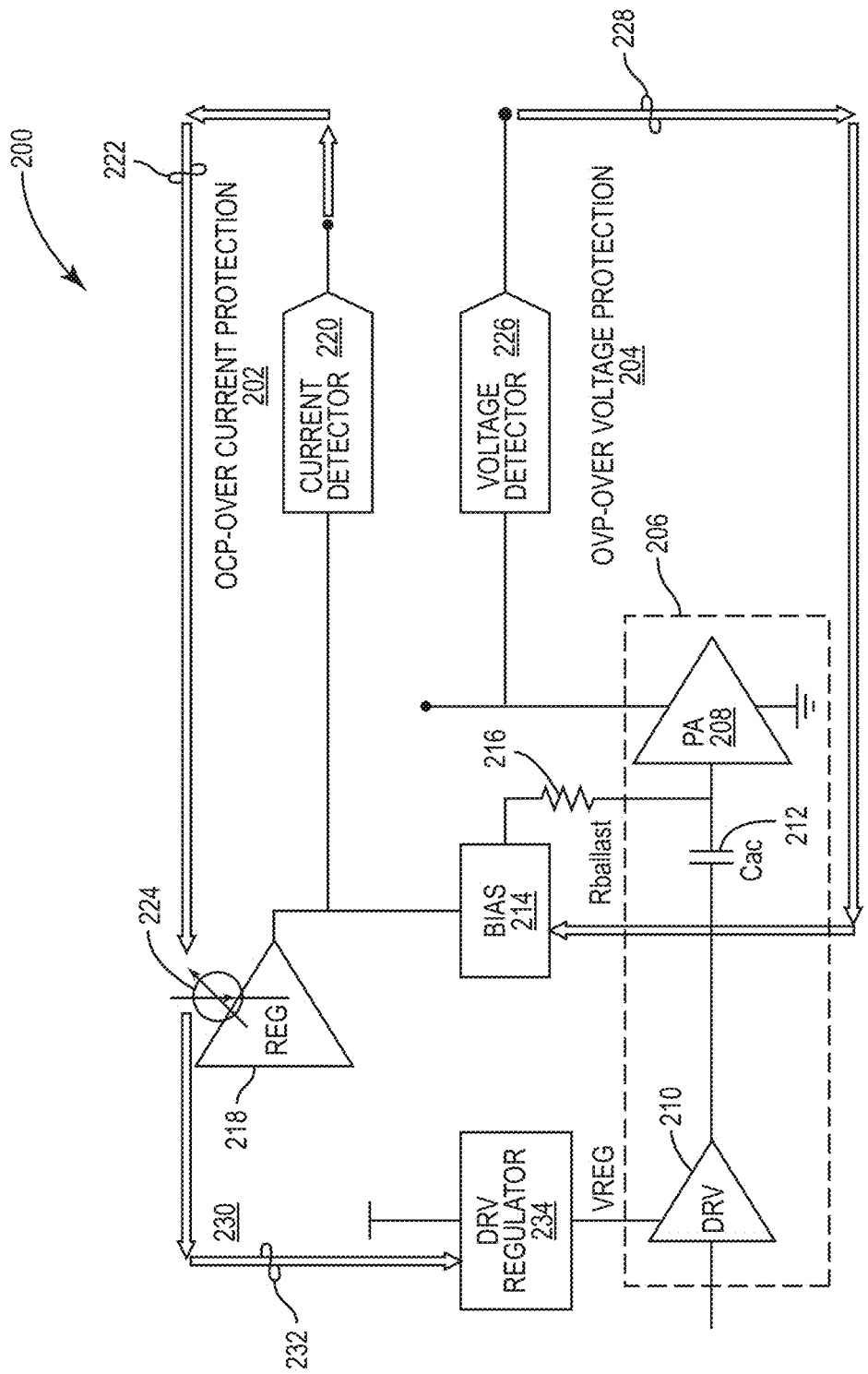
FIG. 6 is a block diagram of a power amplifier circuit having independent overcurrent and overvoltage detector circuits where an overcurrent protection signal from the overcurrent detector circuit is also provided to a driver stage of an power amplifier to control an input signal to an output stage of the power amplifier using a regulator circuit.
Figure 7:
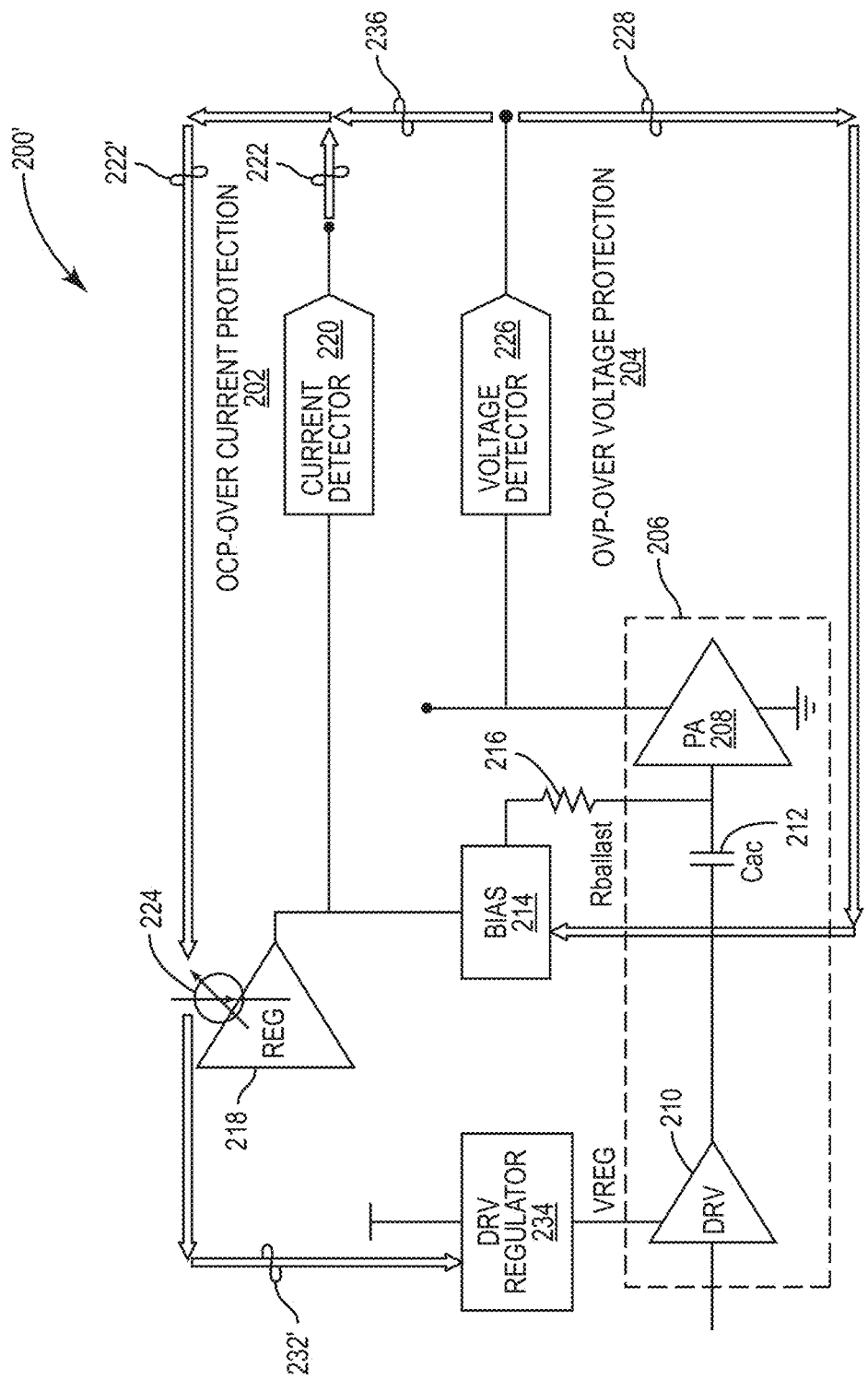
Figure 8:
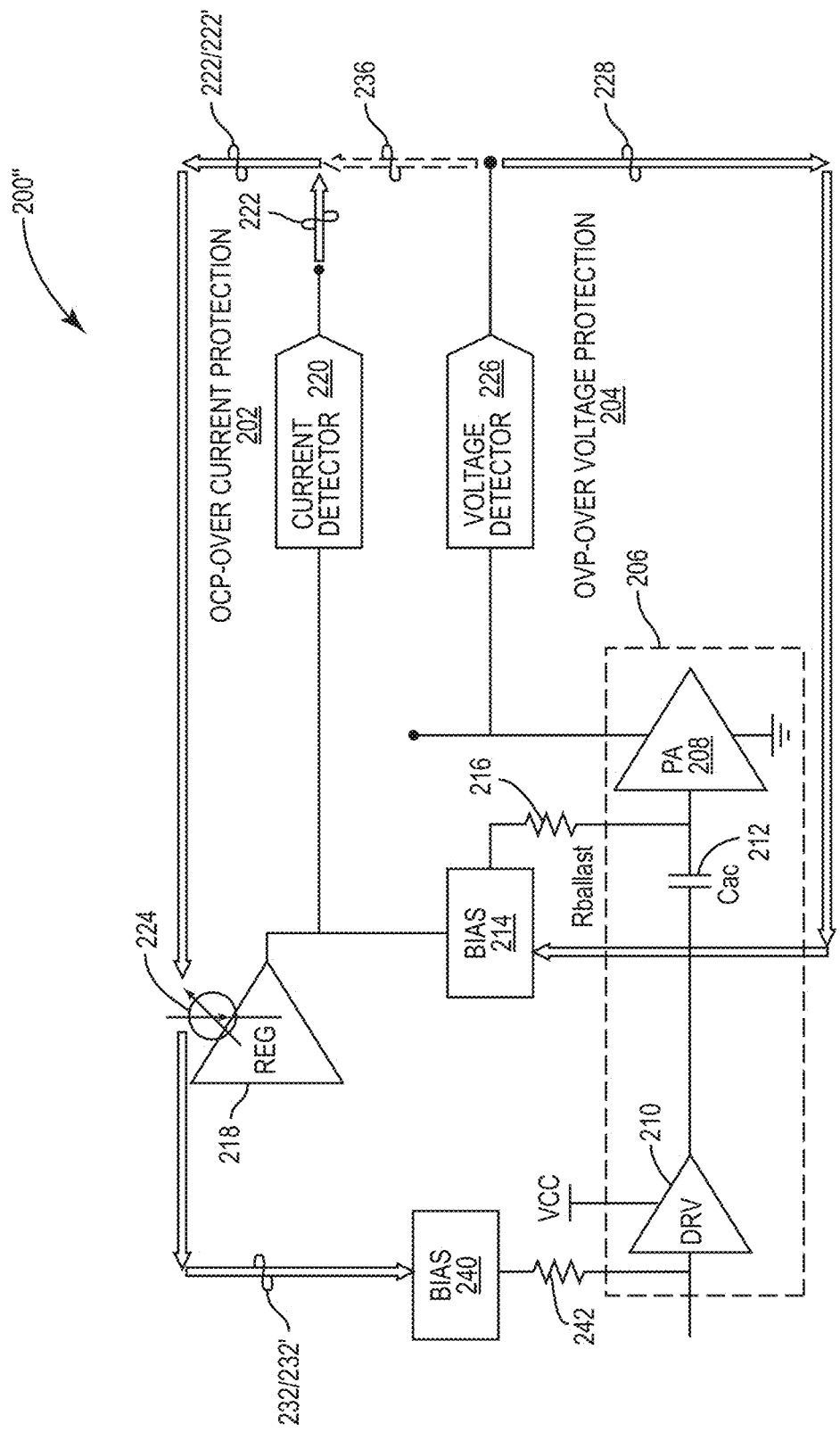
Figure 9:
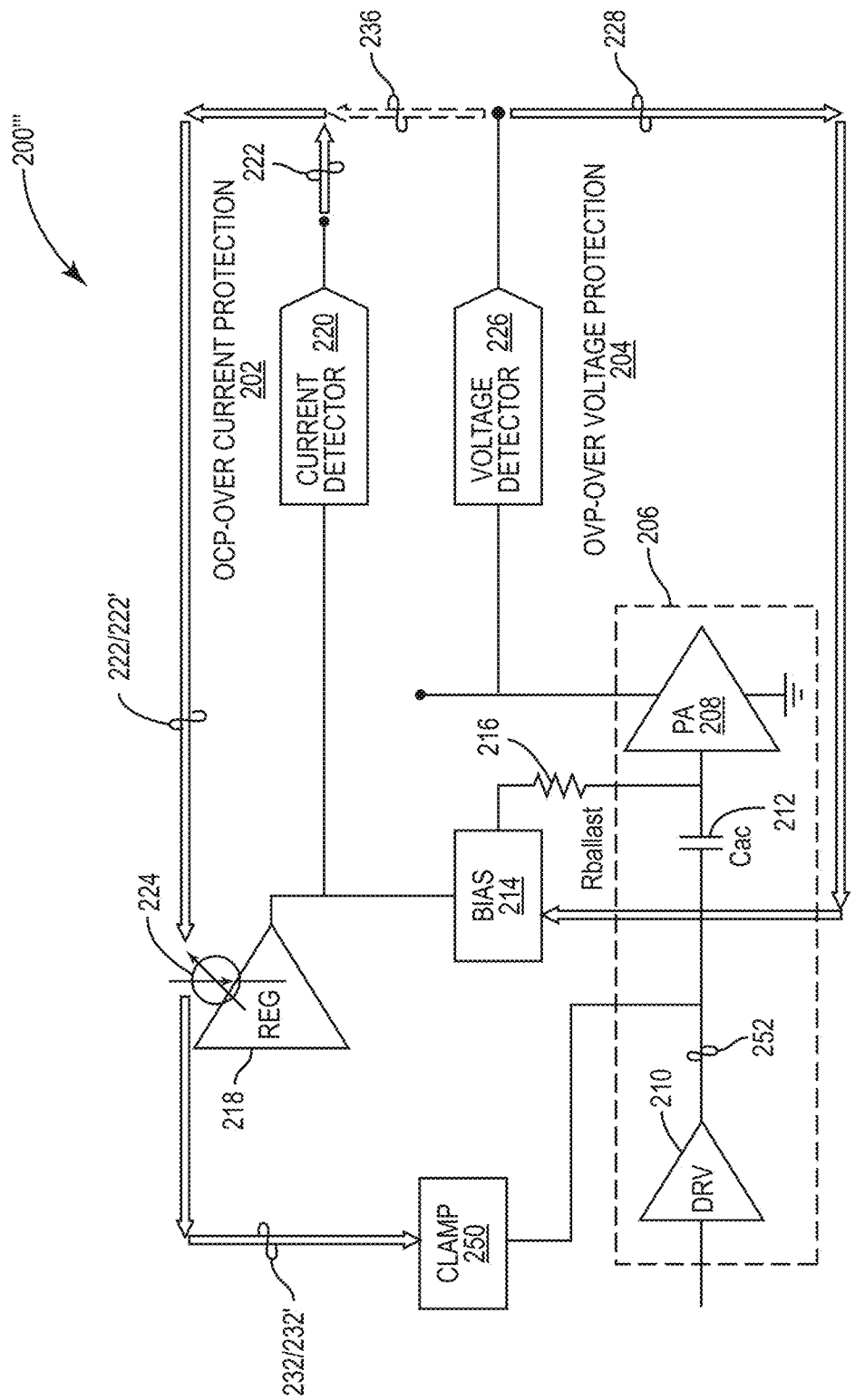
Figure 10:
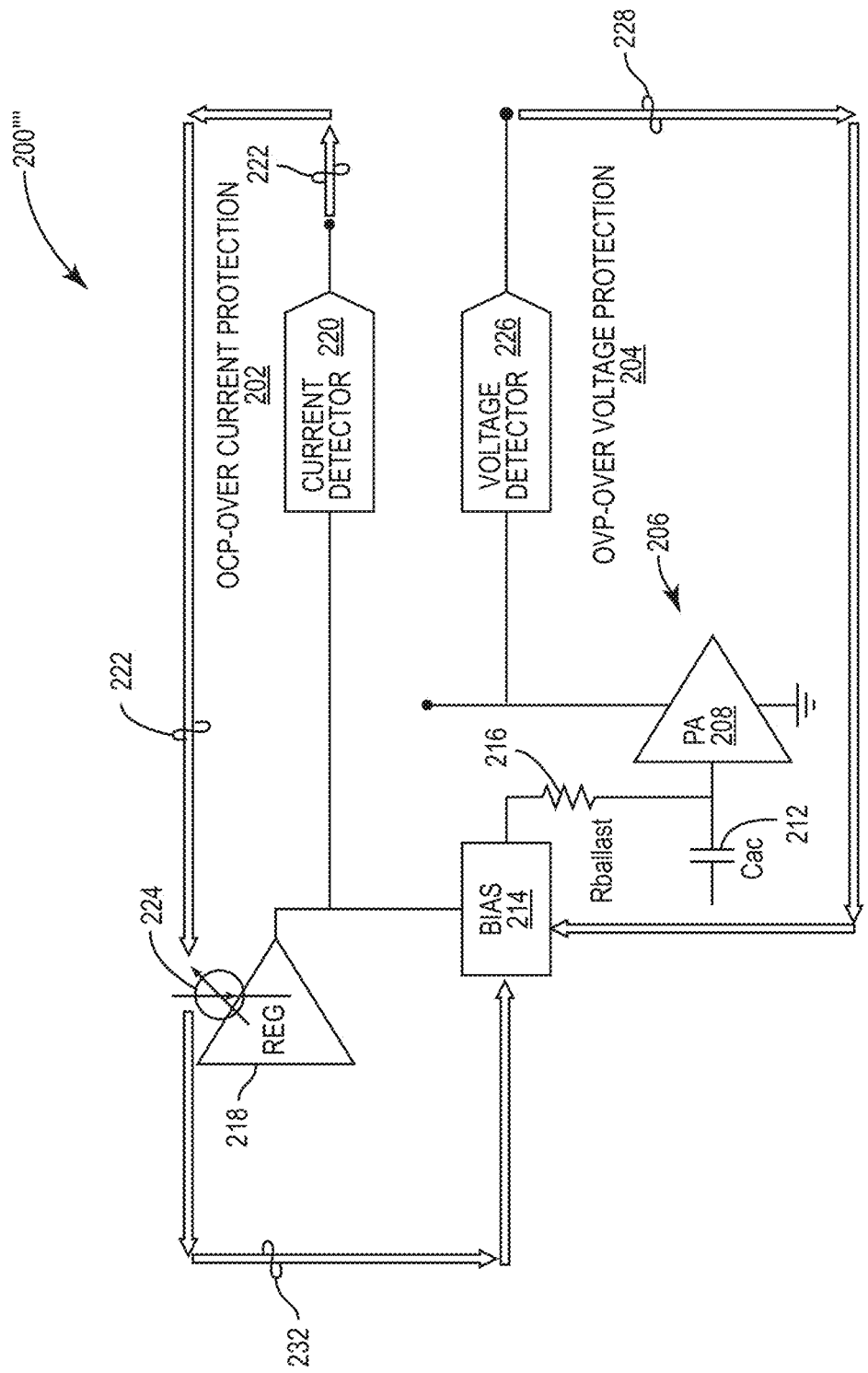
Figure 11:
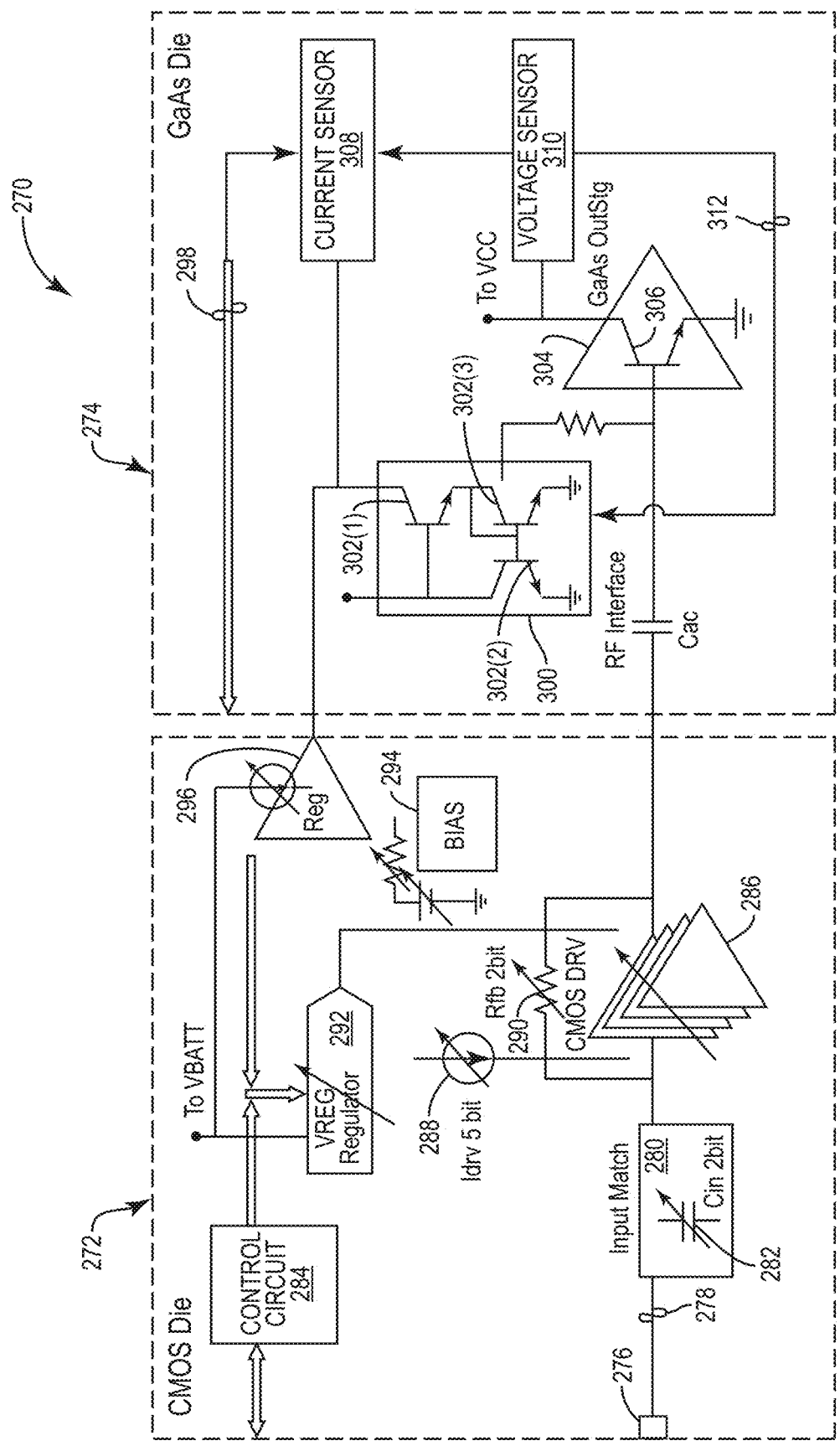
Figure 12:
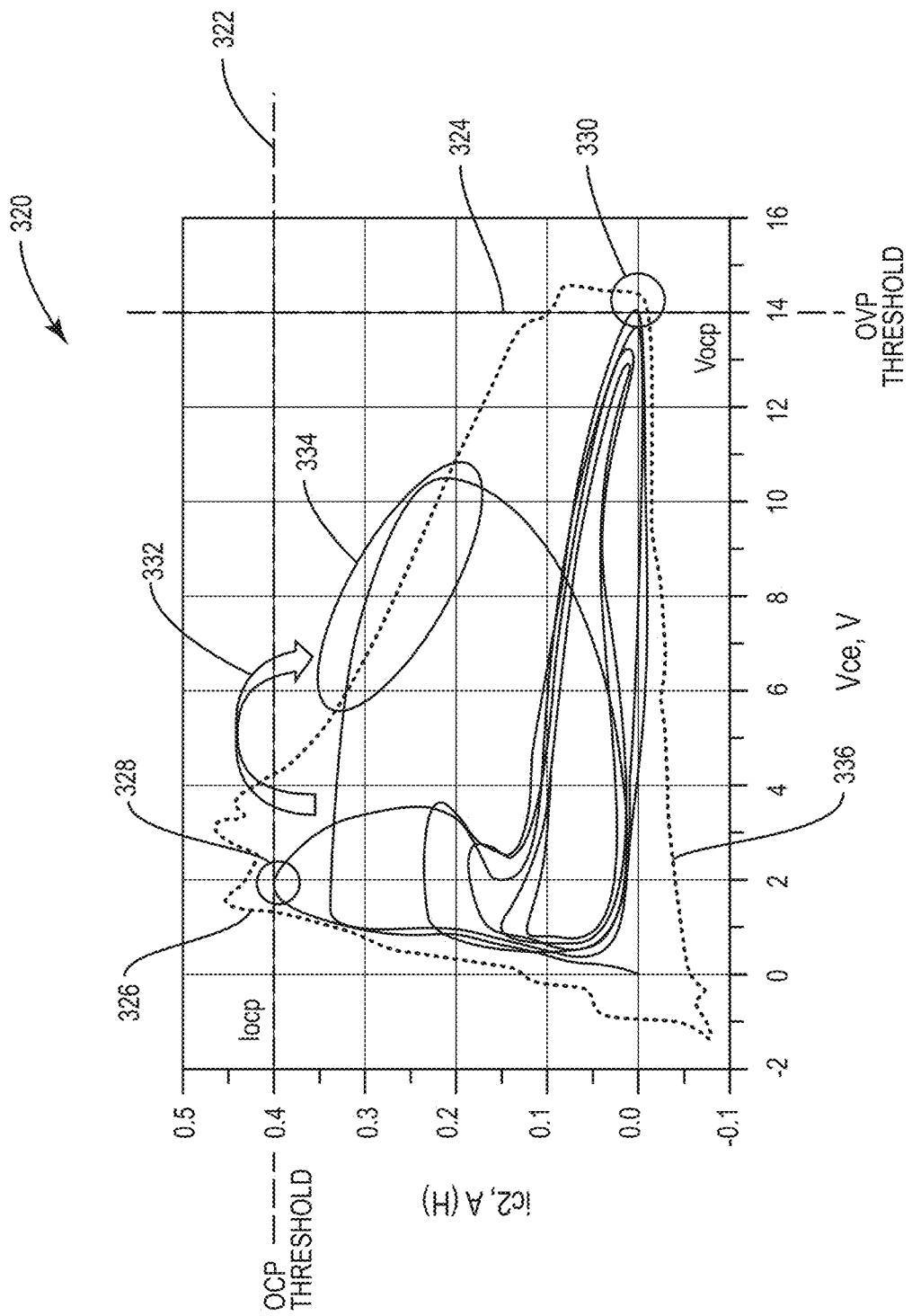
Figure 13:
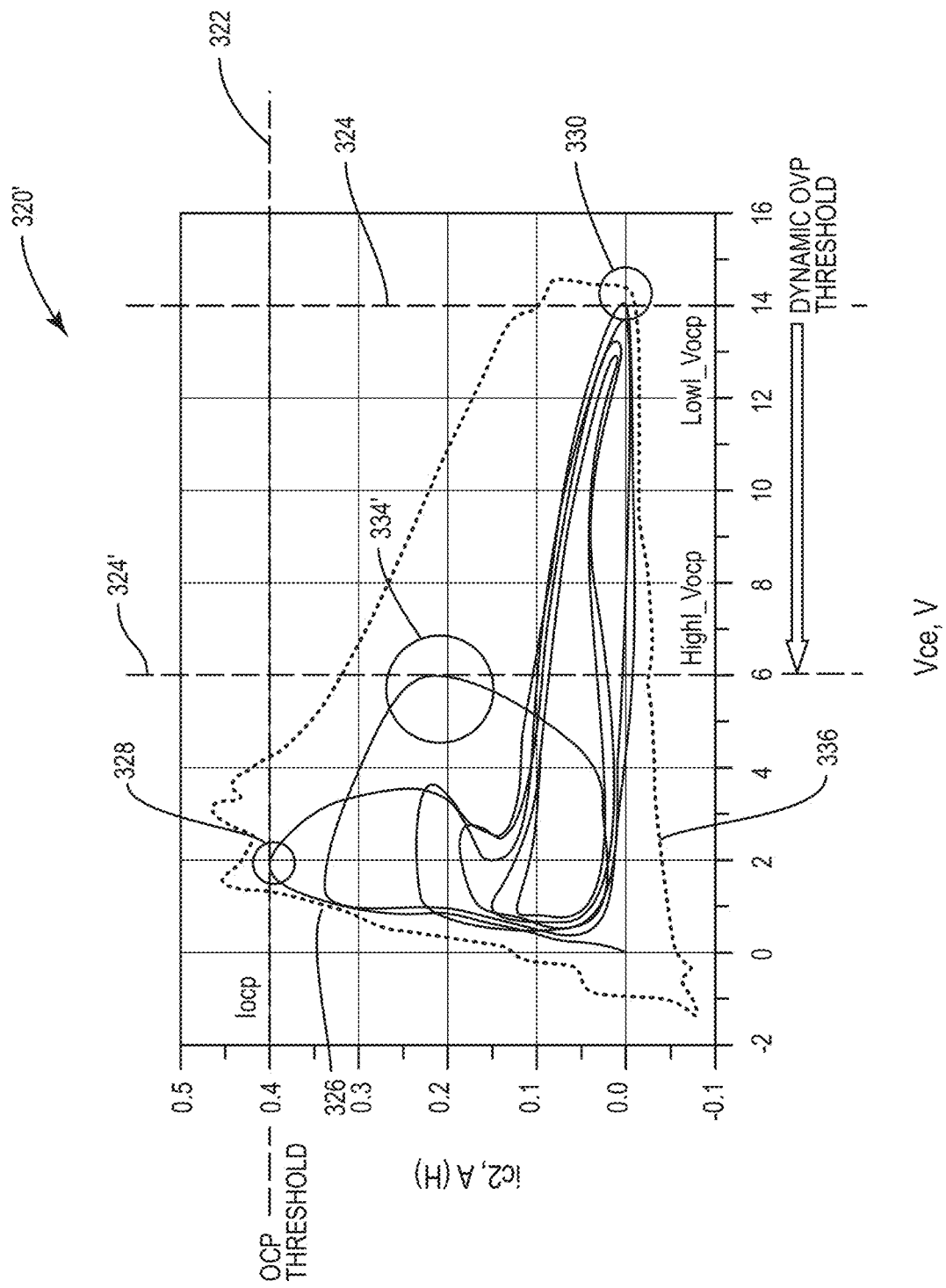
Figure 14:
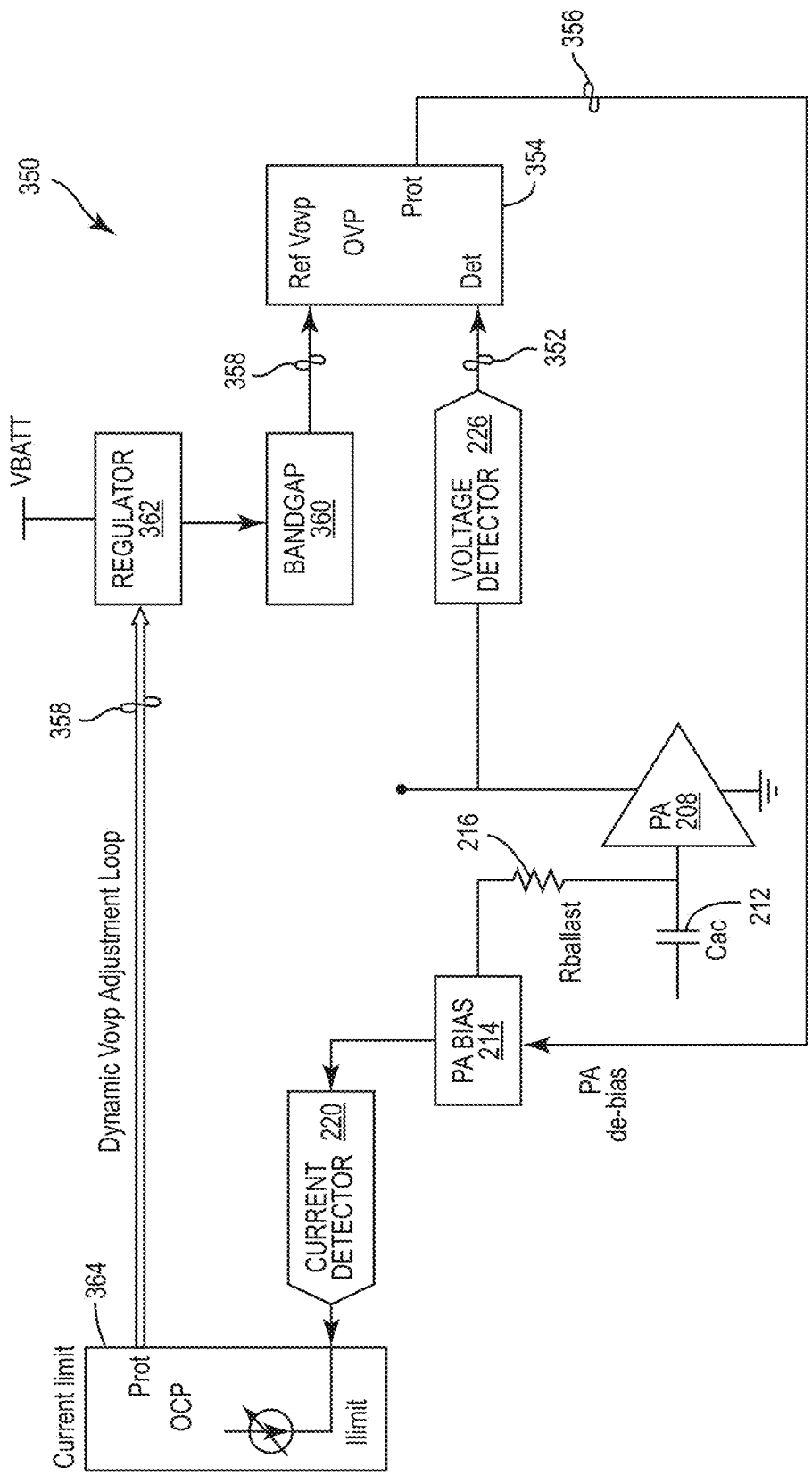
Figure 15:
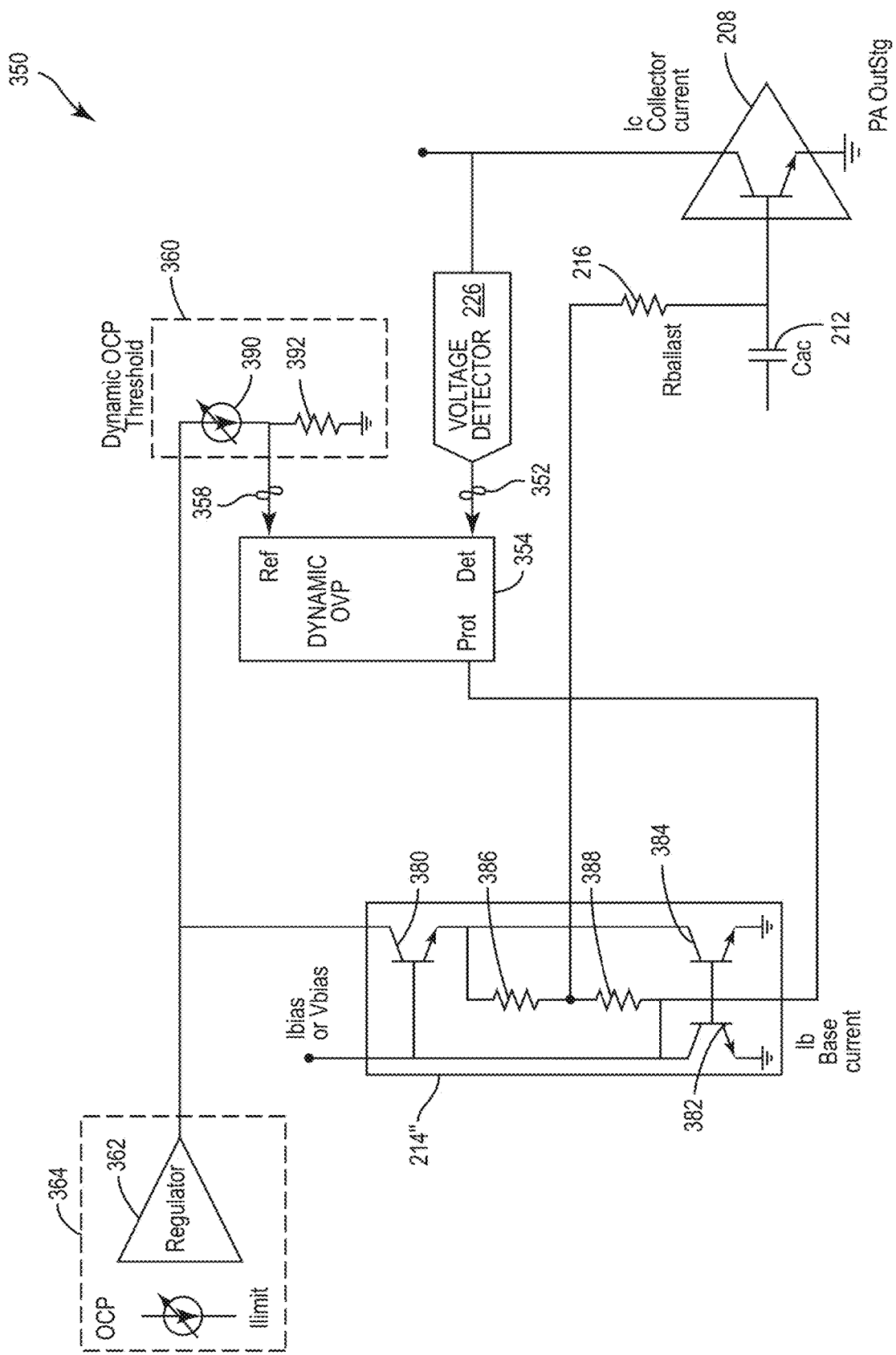
Figure 16:
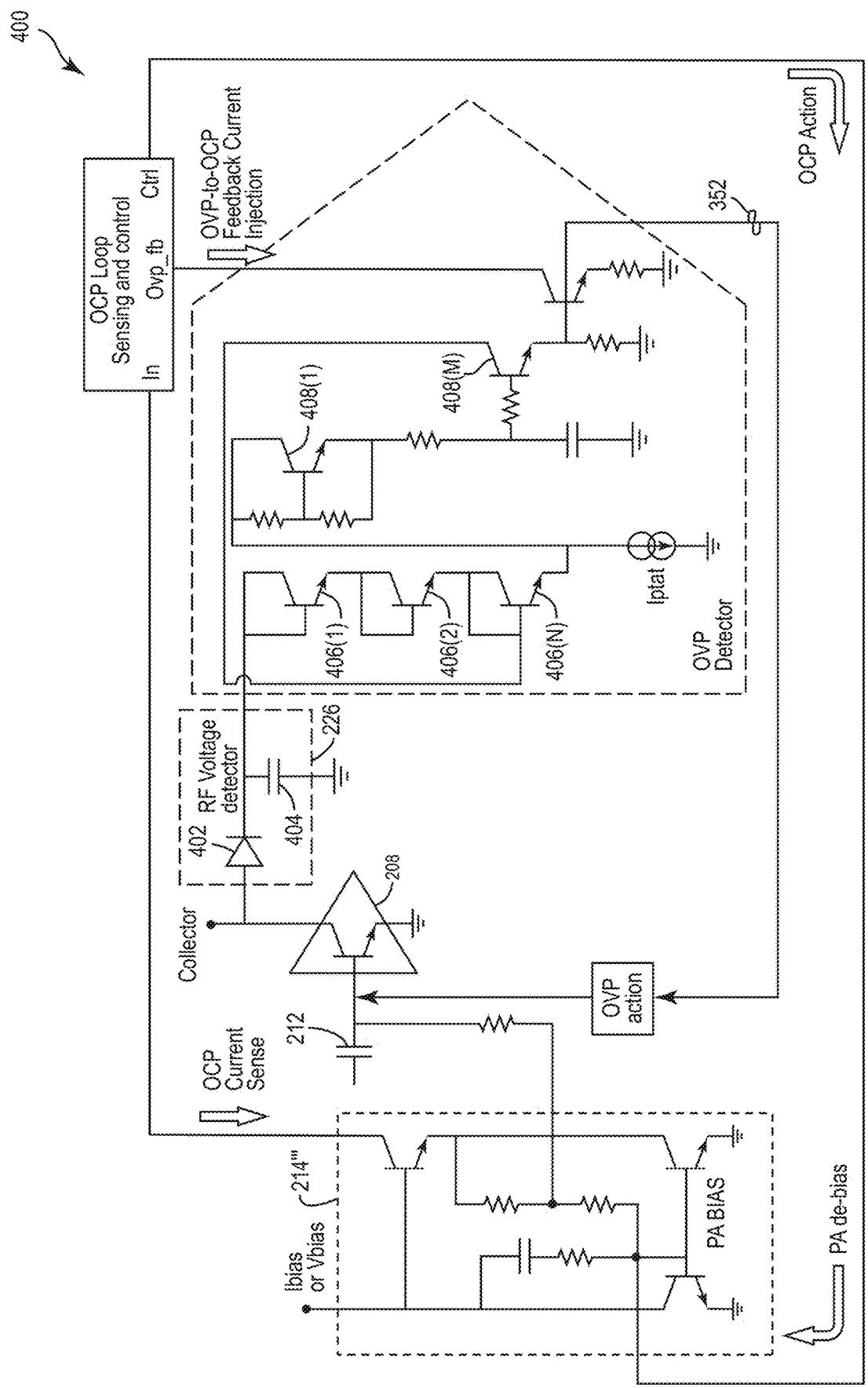
Figure 17:
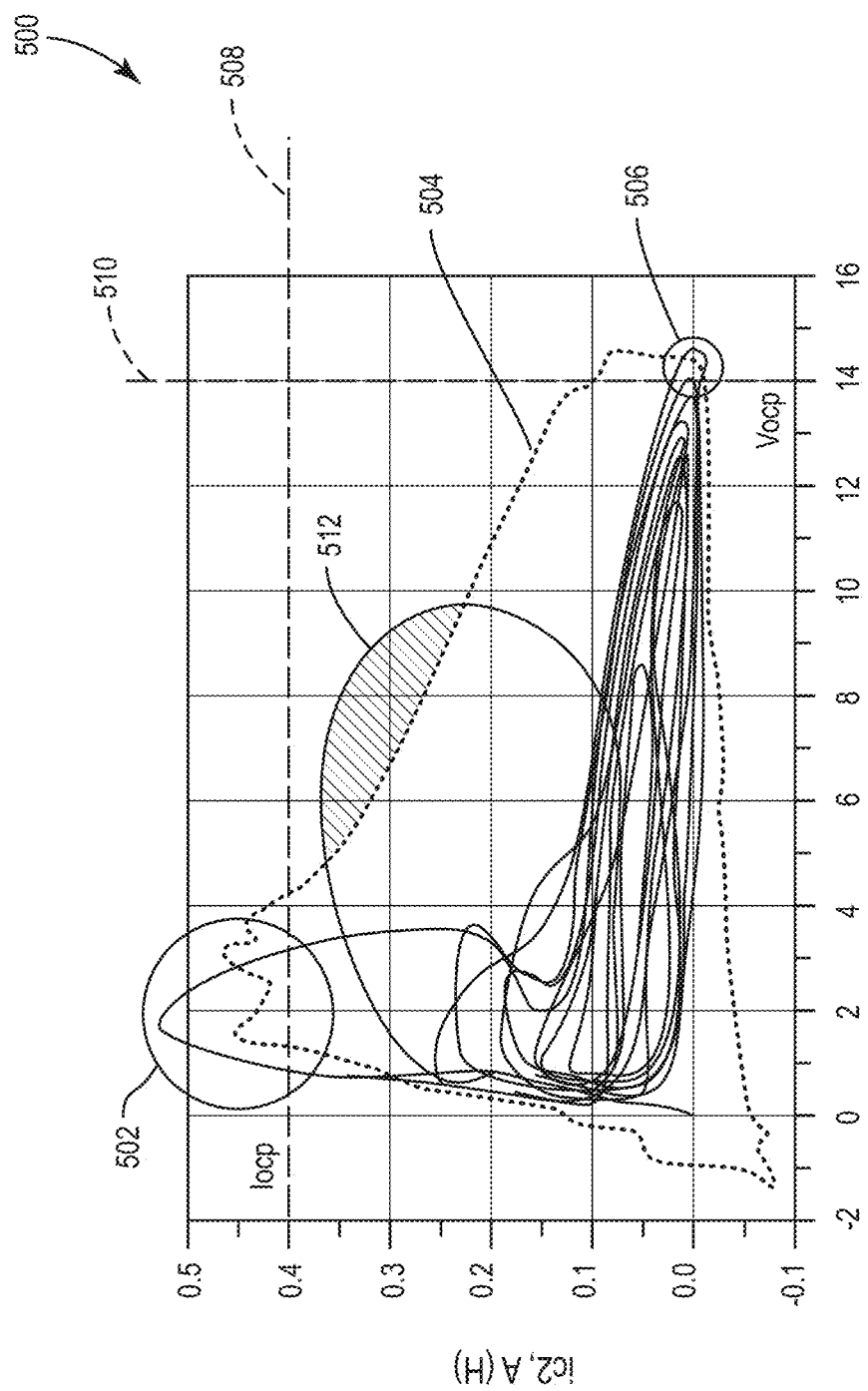
Figure 18:
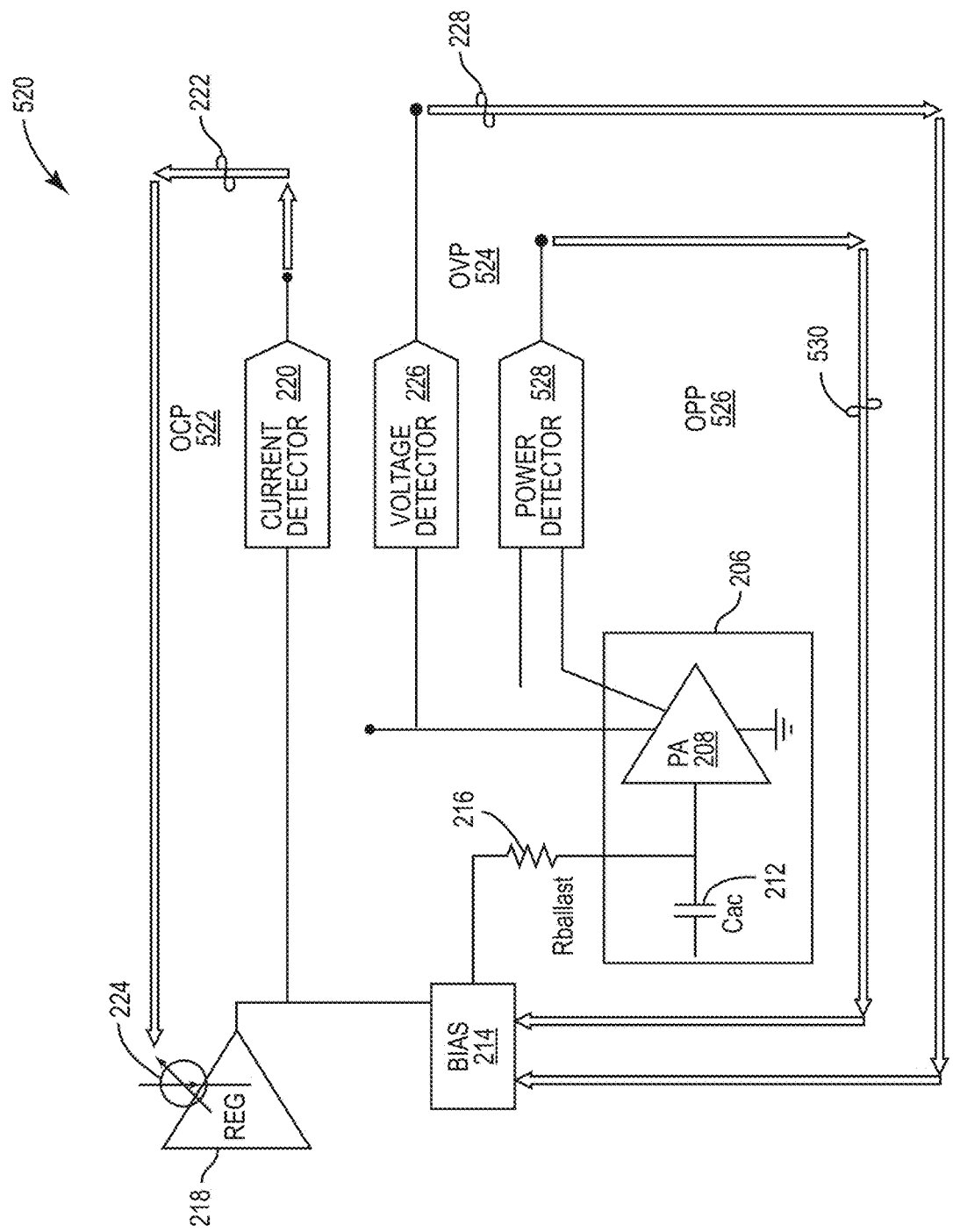
Figure 19:
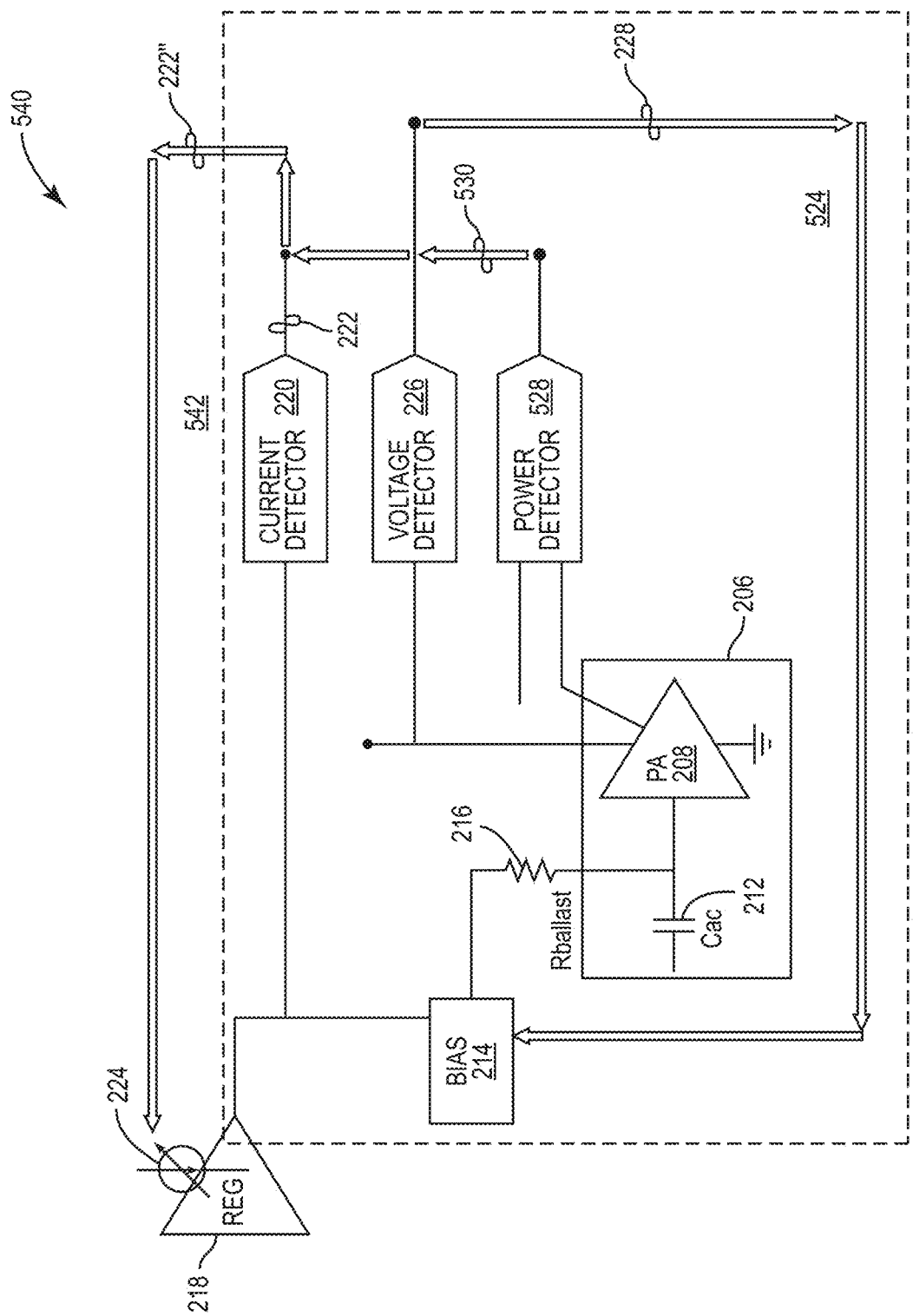
Figure 21:
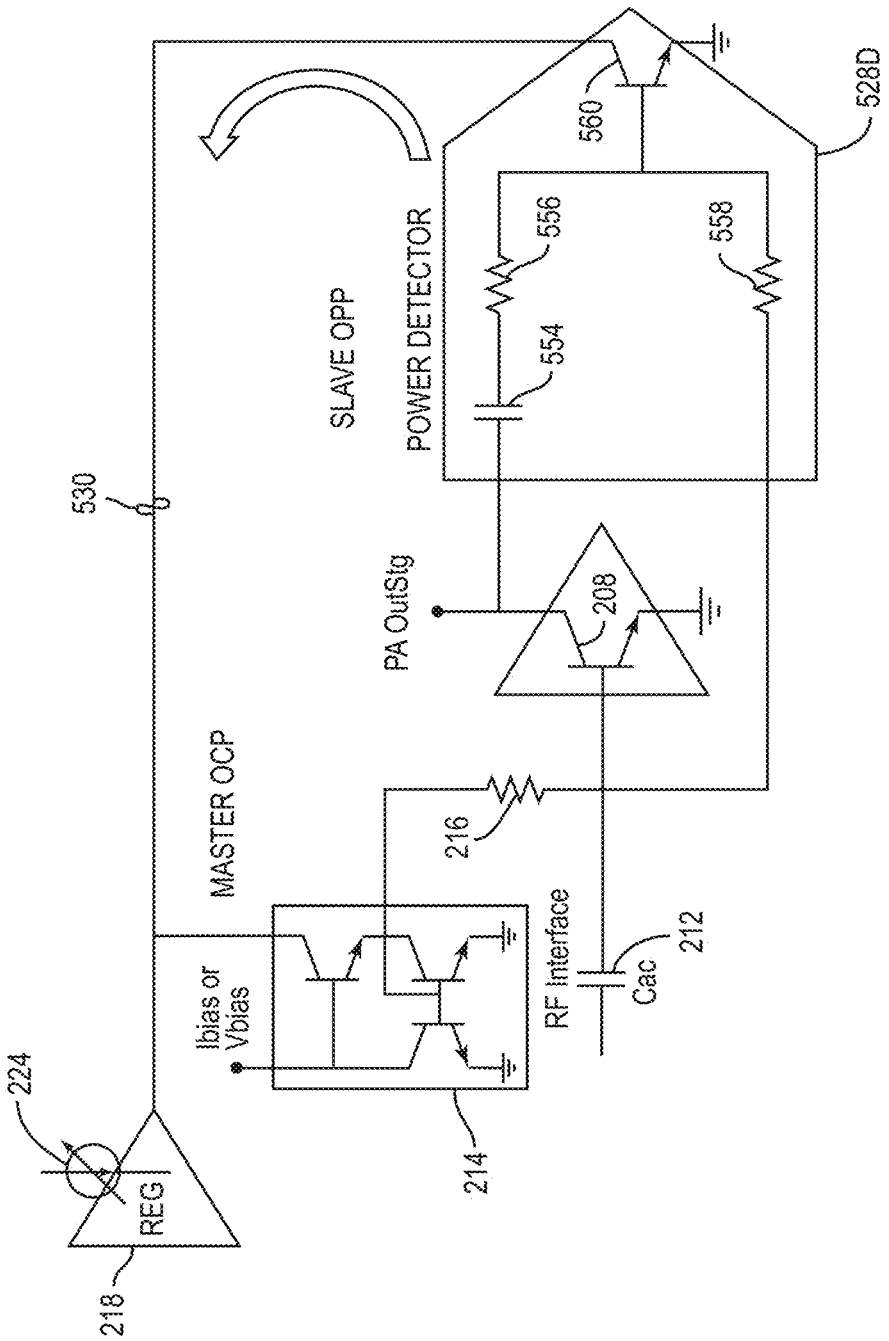
Figures 23, 24:
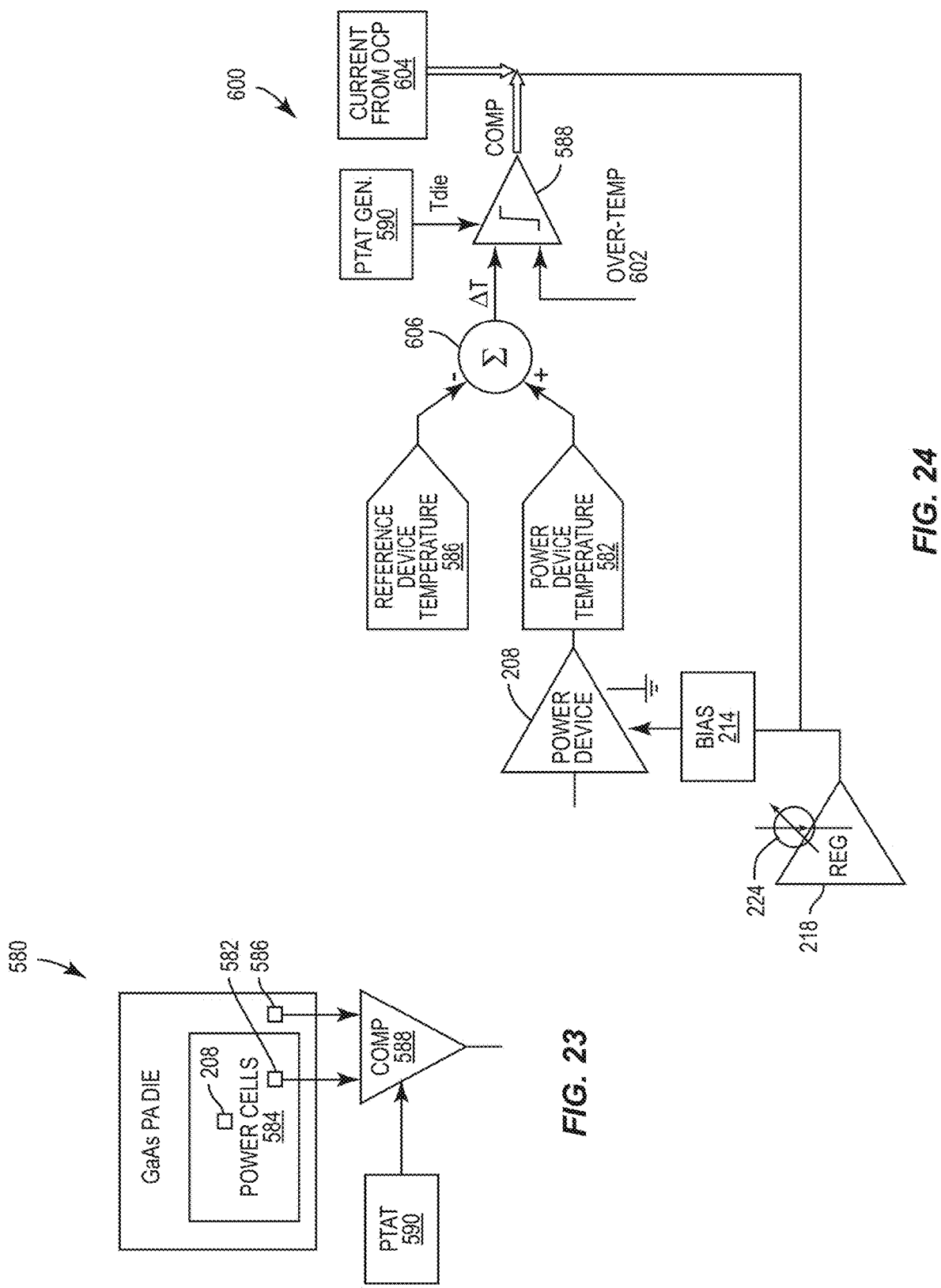
Figure 25:
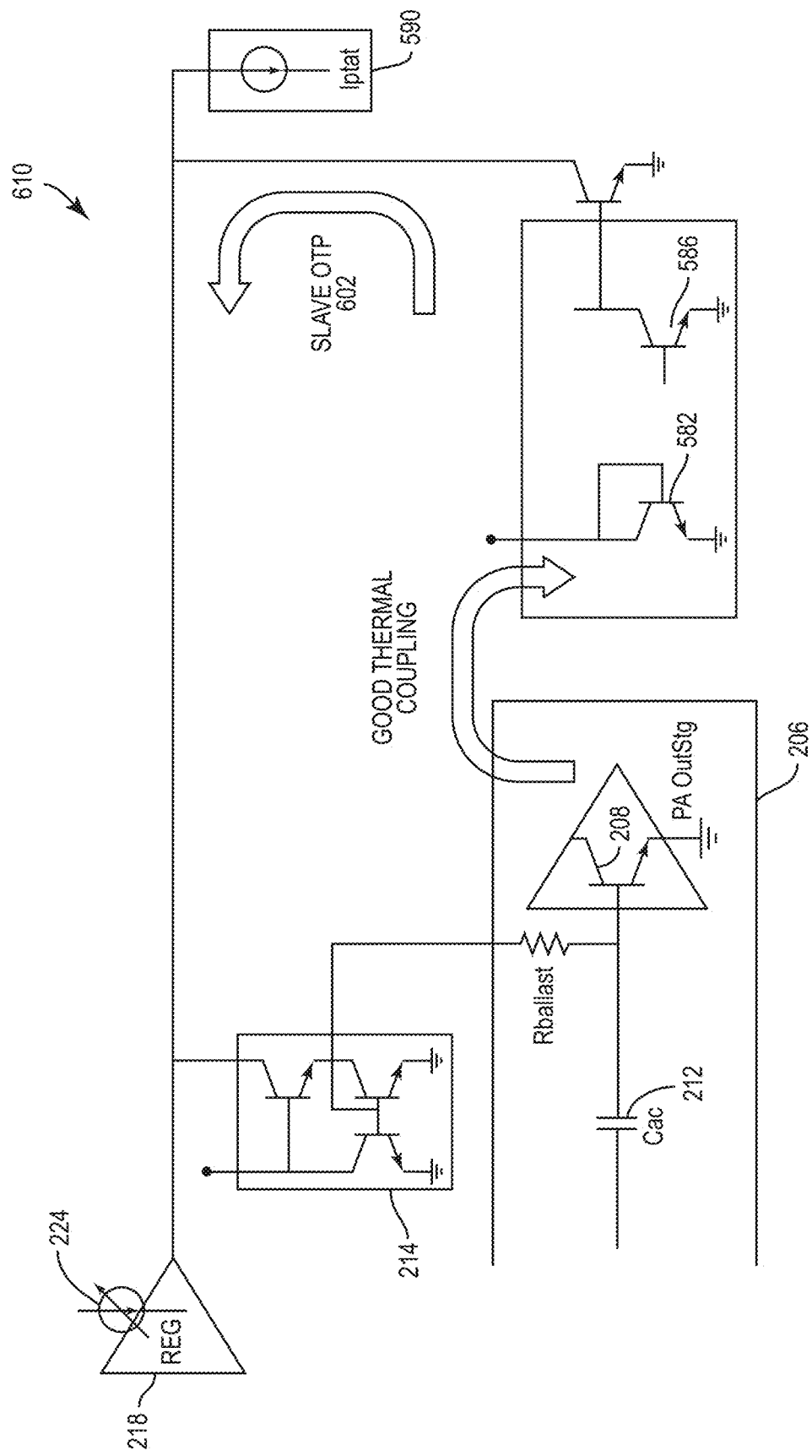
Figure 26:
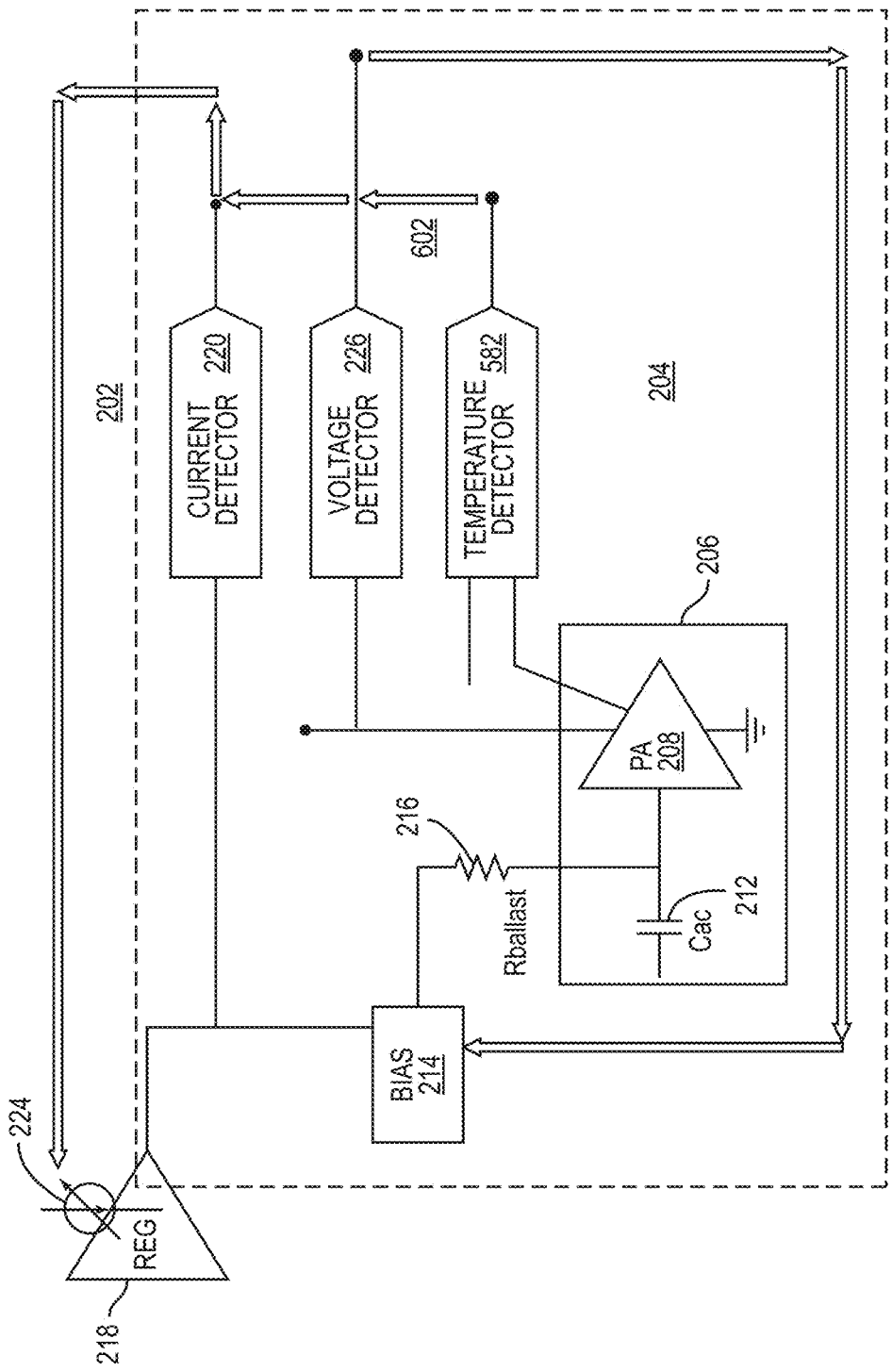
Figure 27:
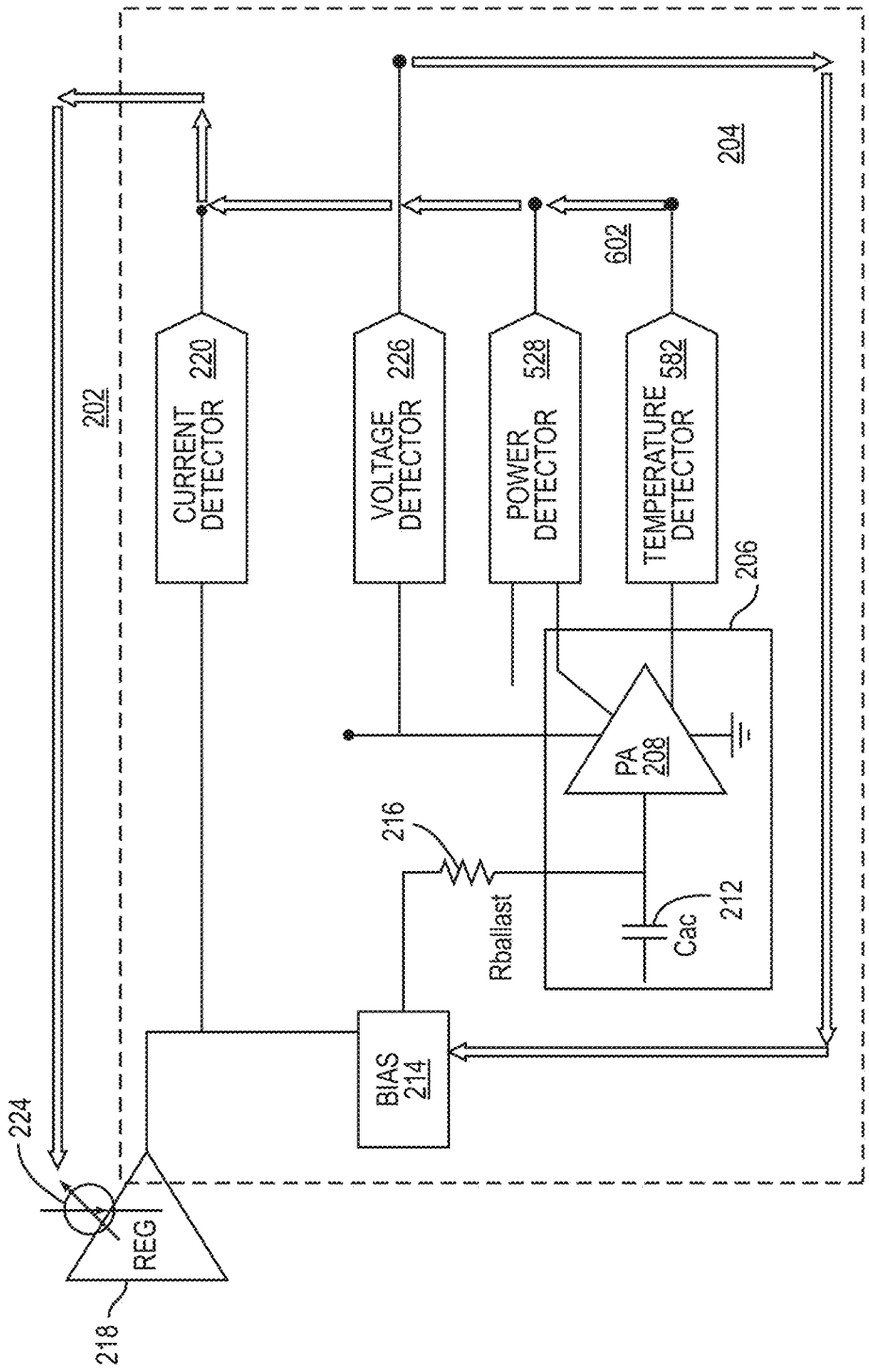
Figure 28:
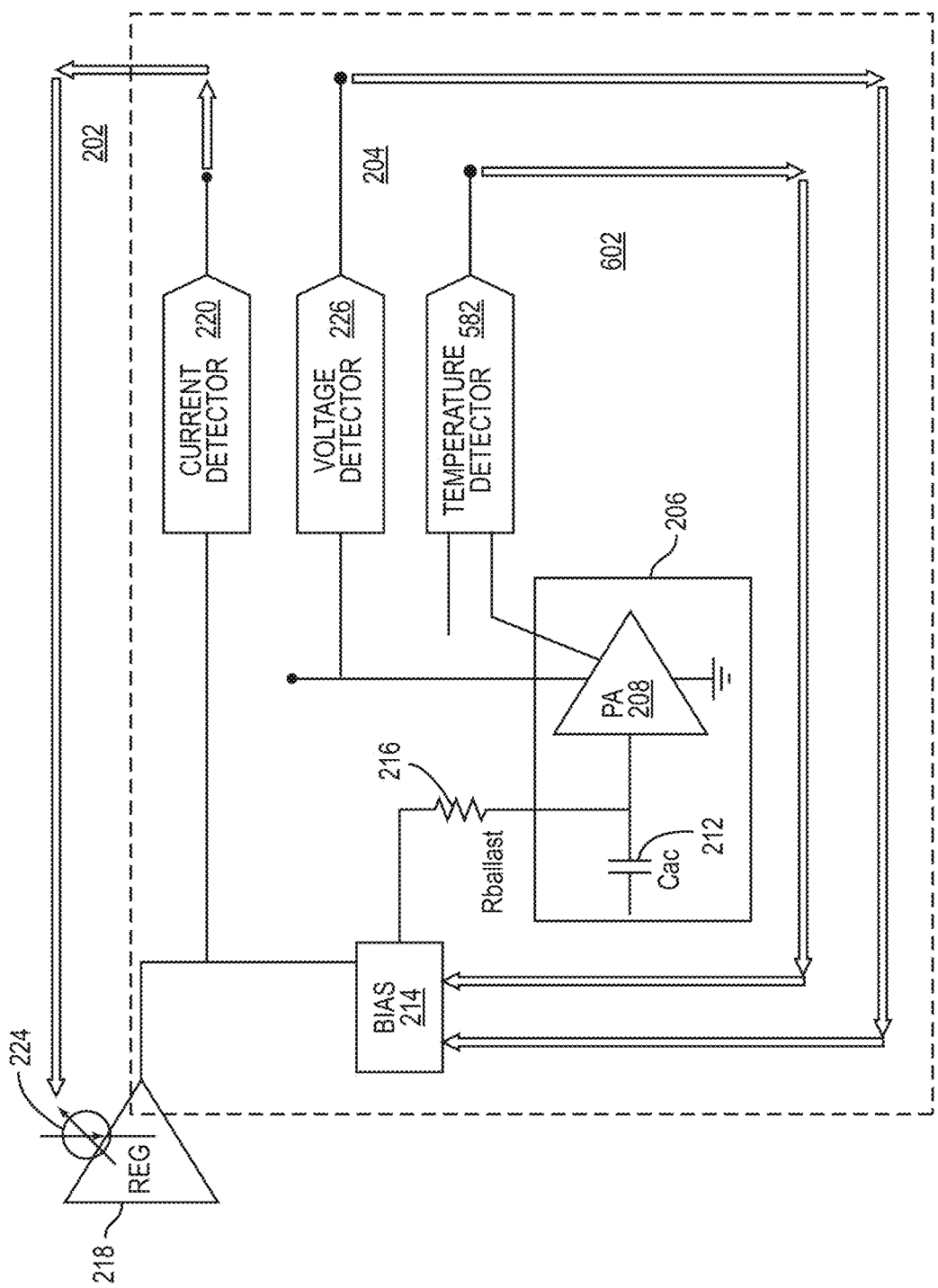
Figure 29:
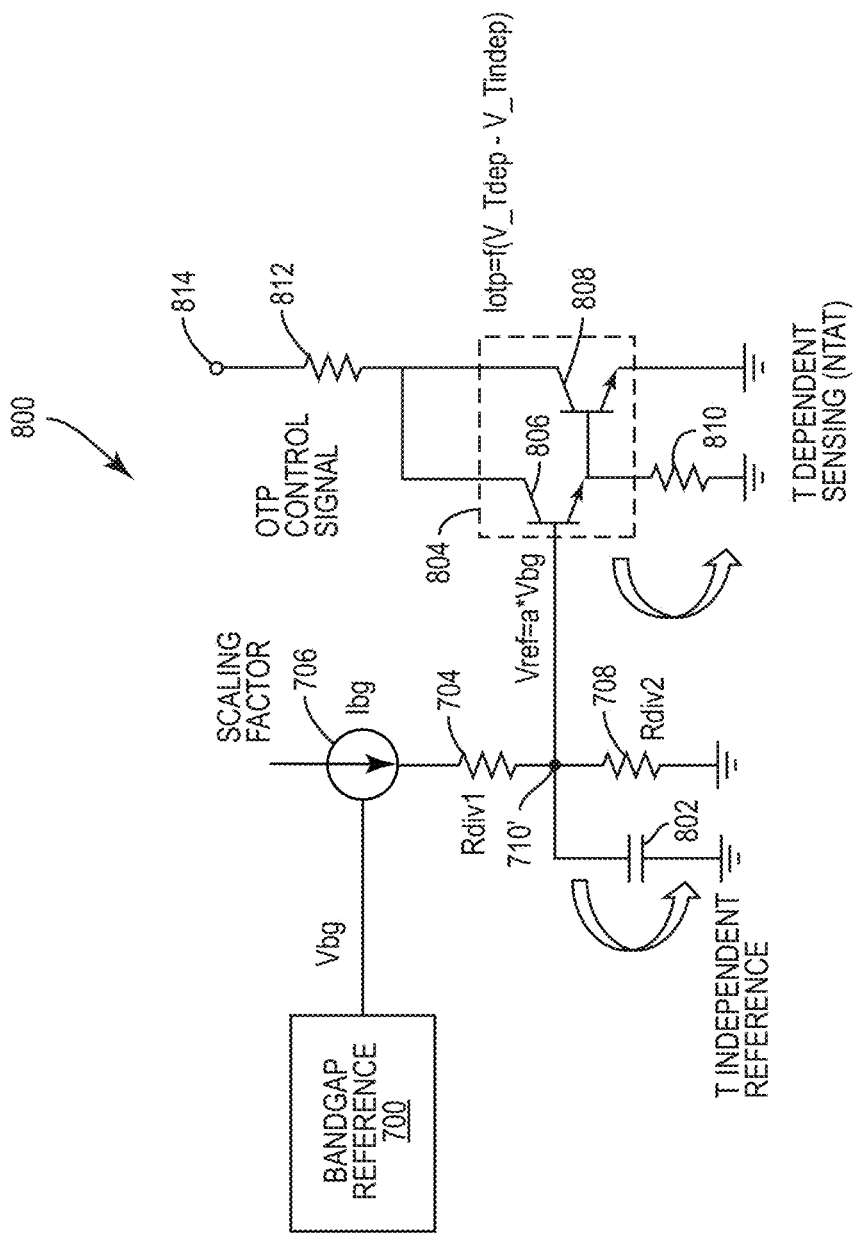

FIG. 7 is a block diagram of a power amplifier circuit having overcurrent and overvoltage detector circuits where an overcurrent protection signal from the overcurrent detector circuit is also provided to a driver stage of an power amplifier to control an input signal to an output stage of the power amplifier and where the overvoltage detection circuit provides a signal that is summed with the overcurrent protection signal;

FIG. 8 is a block diagram of a power amplifier circuit having overcurrent and overvoltage detector circuits where an overcurrent protection signal from the overcurrent detector circuit is also provided to a driver stage of an power amplifier to control an input signal to an output stage of the power amplifier using a second bias circuit;

FIG. 9 is a block diagram of a power amplifier circuit having overcurrent and overvoltage detector circuits where an overcurrent protection signal from the overcurrent detector circuit is also provided to a clamp to control an input signal to an output stage of the power amplifier;

FIG. 10 is a block diagram of a power amplifier circuit having overcurrent and overvoltage detector circuits where an overcurrent protection signal from the overcurrent detector circuit is provided not just to a regulator circuit, but also to a bias circuit;

FIG. 11 is a block diagram of a power amplifier circuit spread across two dies, where the power amplifiers are instantiated as bipolar junction transistors in a first die and a driver circuit is instantiated as a complementary metal oxide semiconductor (CMOS) field effect transistors (FETs) in a second die;

FIG. 12 is a current versus voltage diagram showing a safe region of operation and how exemplary aspects of the present disclosure prevent exiting the safe region of operation;

FIG. 13 is a current versus voltage diagram showing a safe region of operation and how exemplary aspects of the present disclosure dynamically lower overvoltage threshold levels to remain in the safe region of operation;

FIG. 14 is block diagram of a power amplifier circuit having overcurrent and overvoltage detector circuits where an overcurrent protection signal from the overcurrent detector circuit also provides a dynamic adjustment to overvoltage threshold level;

FIG. 15 is a circuit diagram of a dynamic overvoltage protection loop according to exemplary aspects of the present disclosure;

FIG. 16 is circuit diagram of the voltage detector of the overvoltage protection loop of FIG. 15;

FIG. 17 is a current versus voltage diagram showing a safe region of operation with overcurrent, overvoltage, and overpower conditions highlighted;

FIG. 18 is a block diagram of a power amplifier circuit having an overpower protection loop operating independently of other overcondition protection loops;

FIG. 19 is a block diagram of a power amplifier circuit having an overpower protection loop operating in conjunction with an overcurrent protection loop;

FIGS. 20A-20C illustrate schematic diagrams for power detection circuits that may be used by overpower protection loops;

FIG. 21 is a block diagram of a power amplifier circuit having just an overpower protection loop that includes an exemplary power detection circuit;

FIG. 22A is a block diagram of a temperature sensor that may be used for an overtemperature protection loop;

FIG. 22B is a block diagram of an alternate exemplary temperature sensor with a fixed reference temperature;

FIG. 22C is a block diagram of a scaling factor circuit that may be used with the temperature sensor of FIG. 22B;

FIG. 23 is a block diagram of a temperature sensor with a proportional to absolute temperature (PTAT) circuit that may be used for an overtemperature protection loop;

FIG. 24 is a block diagram of a temperature protection loop that may work with an overcurrent protection loop;

FIG. 25 is a block diagram of an alternate temperature protection loop that may work with an overcurrent protection loop;

FIG. 26 is a block diagram of a temperature protection loop working with an overcurrent protection loop such as shown in FIG. 6;

FIG. 27 is a block diagram of a power amplifier circuit with all four overcondition loops present;

FIG. 28 is a block diagram of an overtemperature loop operating independently of overvoltage and overcurrent protection loops; and FIG. 29 is a block diagram of an overtemperature protection loop using a bandgap voltage and a Darlington configuration.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power amplifier with protection loops. Specifically, exemplary aspects contemplate providing an over-power protection loop and/or an over-temperature protection loop to assist in preventing operation outside a safe operation zone. These protection loops may operate independently of one another and other protection loops or may be coupled to other protection loops such as an overcurrent protection loop or an overvoltage protection loop. When over-power or over-temperature conditions are detected, a signal may be generated that throttles input(s) to the power amplifier, which, in turn, reduces the chance that the power amplifier will operate outside a safe operating area of the power amplifier, thereby satisfying the testing criteria of the mobile communication device manufacturers and likely extending the life cycle of the power amplifier.

Before addressing particular aspects of the present disclosure, a brief discussion of the context is provided. Specifically, FIGS. 1 through 16 discuss the basic concepts behind overcurrent and overvoltage protection loops. While these overcondition loops are useful, particularly when the overvoltage protection loop works with the overcurrent protection loop to reduce the voltage threshold for overvoltage conditions, the solutions provided therein may not protect the power amplifier from all rugged conditions. Exemplary aspects of additional overcondition protection loops, in particular, overpower and overtemperature protection loops are discussed beginning below with reference to FIG. 17.

Figure 1:
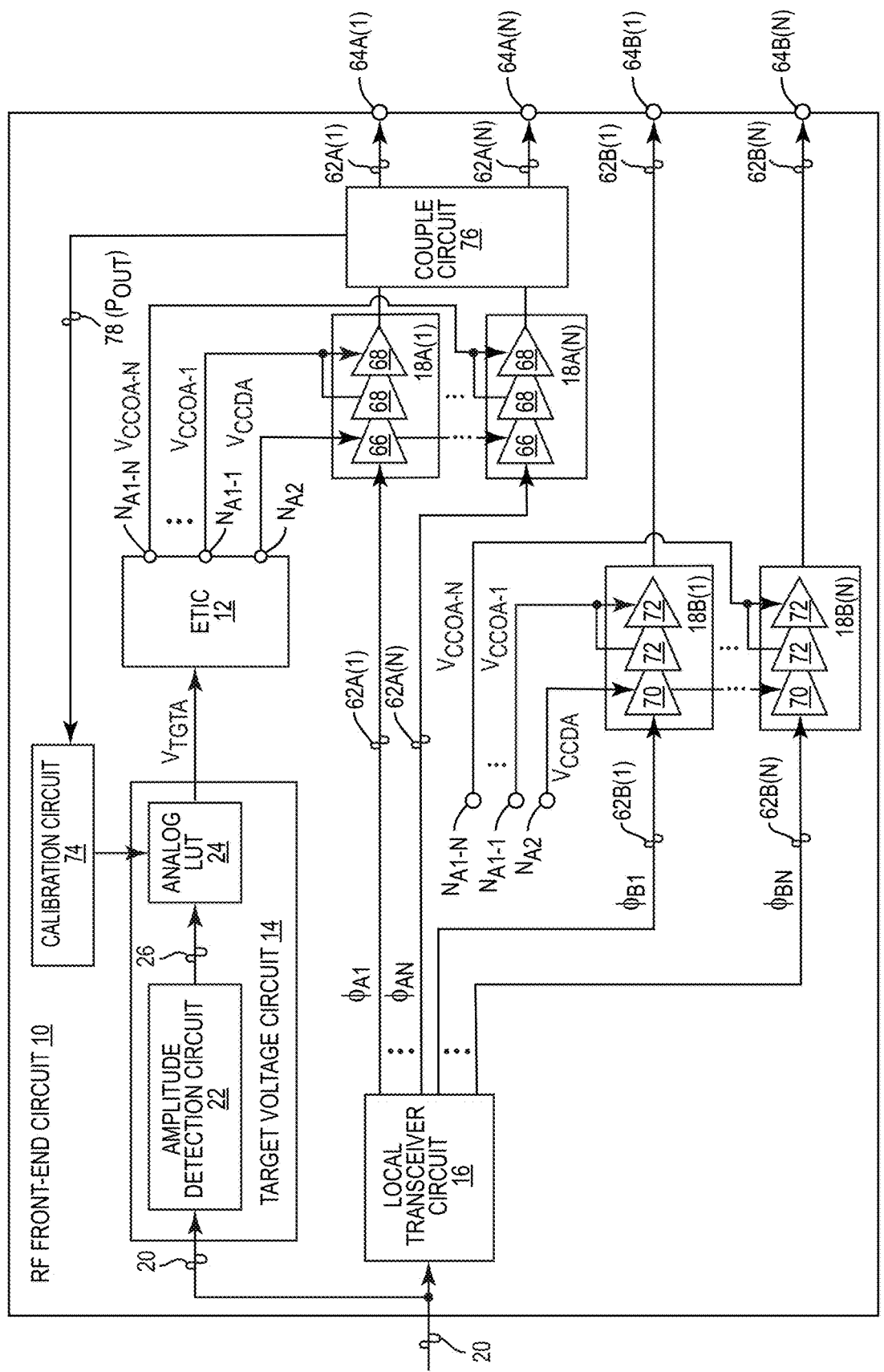
FIG. 1 is a schematic diagram of an exemplary radio frequency (RF) front-end circuit configured according to an embodiment of the present disclosure.

FIG. 1 is a schematic diagram of an exemplary RF front-end circuit 10 configured according to an embodiment of the present disclosure. In embodiments disclosed herein, the RF front-end circuit 10 may be self-contained in a system-on-chip (SoC) or system-in-package (SiP), as an example, to provide all essential functions of an RF front-end module (FEM). Alternatively, different portions of the RF front-end circuit 10 may be provided on different dies. In some embodiments, the different dies may be made from different materials (e.g., GaAs, GaAn, Si, SiG, SiN or the like) and/or may be different technologies (e.g., bipolar junction transistors (BJTs), heterojunction transistors, field effect transistors (FETs), complementary metal oxide semiconductor (CMOS) FETs, or the like). As illustrated, the RF front-end circuit 10 is configured to include an envelope tracking integrated circuit (ETIC) 12, a target voltage circuit 14, a local transceiver circuit 16, and a number of power amplifiers 18A(1)-18A(N). The RF front-end circuit 10 may also include a number of second power amplifiers 18B(1)-18B(N).

The ETIC 12 is configured to generate a number of first ET voltages $V_{CCOA-1}$-$V_{CCOA-N}$ at a number of first output nodes $N_{A1-1}$-$NA_{1-N}$, respectively. The ETIC 12 is also configured to generate a second ET voltage $V_{CCDA}$ at a second output node $N_{A2}$. The ETIC 12 generates both the first ET voltages $V_{CCOA-1}$-$V_{CCOA-N}$ and the second ET voltage $V_{CCDA}$ based on a time-variant ET target voltage $V_{TGTA}$. For a detailed description on specific embodiments of the ETIC 12 that generate the first ET voltages $V_{CCOA-1}$-$V_{CCOA-N}$ and the second ET voltage $V_{CCDA}$ based on the time-variant ET target voltage $V_{TGTA}$, please refer to U.S. patent application Ser. No. 17/142,507, entitled "ENVELOPE TRACKING POWER MANAGEMENT APPARATUS INCORPORATING MULTIPLE POWER AMPLIFIERS."

The target voltage circuit 14 is configured to generate the time-variant ET target voltage $V_{TGTA}$ based on an input signal 20, which can be a modulated carrier signal at millimeter wave (mmWave) frequency, intermediate frequency (IF), or In-phase/Quadrature (I/Q) baseband frequency. In a non-limiting example, the target voltage circuit 14 includes an amplitude detection circuit 22 and an analog lookup table (LUT) 24. The amplitude detection circuit 22 is configured to detect a number of time-variant amplitudes 26 of the input signal 20 and the analog LUT 24 is configured to generate the time-variant ET target voltage $V_{TGTA}$ based on the time-variant amplitudes 26.

The local transceiver circuit 16 may be coupled to a baseband transceiver circuit (not shown), which is separated from the RF front-end circuit 10 by a conductive distance that can stretch to several centimeters. The baseband transceiver circuit may provide the input signal 20 to the local transceiver circuit 16 in IF to help reduce distortion over the conductive distance. In this regard, in a non-limiting example, the baseband transceiver circuit can upconvert a baseband frequency signal to the IF to form the input signal 20. The local transceiver circuit 16 is configured to generate a number of RF signals 62A(1)-62A(N) and a number of second RF signals 62B(1)-62B(N) in an RF frequency (a.k.a. carrier frequency) higher than the IF based on the input signal 20.

Each of the power amplifiers 18A(1)-18A(N) is coupled to a respective one a number of antenna ports 64A(1)-64A(N) and configured to amplify a respective one of the RF signals 62A(1)-62A(N) based on a respective one of the first ET voltages $V_{CCOA-1}$-$V_{CCOA-N}$ as well as the second ET voltage $V_{CCDA}$. Each of the second power amplifiers 18B(1)-18B(N) is coupled to a respective one a number of second antenna ports 64B(1)-64B(N) and configured to amplify a respective one of the second RF signals 62B(1)-62B(N) based on a respective one of the first ET voltages $V_{CCOA-1}$-$V_{CCOA-N}$ as well as the second ET voltage $V_{CCDA}$.

The antenna ports 64A(1)-64A(N) and the second antenna ports 64B(1)-64B(N) may each be coupled to a respective antenna (not shown) for radiating a respective one of the RF signals 62A(1)-62A(N) and the second RF signals 62B(1)-62B(N). The local transceiver circuit 16 may be configured to generate the RF signals 62A(1)-62A(N) in association with a number of phase offsets $\phi_{A1}$-$\phi_{AN}$, respectively, to provide required phase coherency among the RF signals 62A(1)-62A(N) such that the RF signals 62A(1)-62A(N) can be radiated by respective antennas via RF beamforming. Similarly, the local transceiver circuit 16 may be also configured to generate the second RF signals 62B(1)-62B(N) in association with a number of second phase offsets $\phi_{B1}$-$\phi_{BN}$, respectively, to provide required phase coherency among the second RF signals 62B(1)-62B(N) such that the second RF signals 62B(1)-62B(N) can be radiated by respective antennas via RF beamforming. Notably, each of RF signals 62A(1)-62A(N) may be identical to a respective one of the second RF signals 62B(1)-62B(N) (e.g., having the same content and encoding). As such, the RF signals 62A(1)-62A(N) and the second RF signals 62B(1)-62B(N) may be simultaneously radiated in different polarizations (e.g., horizontal and vertical polarizations).

In a non-limiting example, each of the power amplifiers 18A(1)-18A(N) is a multi-stage power amplifier that includes a driver stage amplifier 66 and one or more output stage amplifiers 68. The driver stage amplifier 66 in each of the power amplifiers 18A(1)-18A(N) is configured to amplify a respective one of the RF signals 62A(1)-62A(N) based on the second ET voltage $V_{CCDA}$. The output stage amplifiers 68 in each of the power amplifiers 18A(1)-18A(N) is coupled between the driver stage amplifier 66 and a respective one of the antenna ports 64A(1)-64A(N). Accordingly, the output stage amplifiers 68 in each of the power amplifiers 18A(1)-18A(N) are configured to further amplify the respective one of the RF signals 62A(1)-62A(N) based on a respective one of the first ET voltages $V_{CCOA-1}$-$V_{CCOA-N}$.

Likewise, each of the second power amplifiers 18B(1)-18B(N) is a multi-stage power amplifier that includes a second driver stage amplifier 70 and one or more second output stage amplifiers 72. The second driver stage amplifier 70 in each of the second power amplifiers 18B(1)-18B(N) is configured to amplify a respective one of the second RF signals 62B(1)-62B(N) based on the second ET voltage $V_{CCD A}$. The second output stage amplifiers 72 in each of the second power amplifiers 18B(1)-18B(N) is coupled between the second driver stage amplifier 70 and a respective one of the second antenna ports 64B(1)-64B(N). Accordingly, the second output stage amplifiers 72 in each of the second power amplifiers 18B(1)-18B(N) are configured to further amplify the respective one of the second RF signals 62B(1)-62B(N) based on a respective one of the first ET voltages $V_{CCOA-1}$-$V_{CCOA-N}$.

The RF front-end circuit 10 may include a calibration circuit 74 and a coupling circuit 76. The coupling circuit 76 may be provided between the power amplifiers 18A(1)-18A(N) and the antenna ports 64A(1)-64A(N) and/or between the second power amplifiers 18B(1)-18B(N) and the second antenna ports 64B(1)-64B(N). The coupling circuit 76 may be configured to provide a feedback signal 78 indicating an output power POUT of any of the power amplifiers 18A(1)-18A(N) and/or any of the second power amplifiers 18B(1)-18B(N). Accordingly, the calibration circuit 74 may be configured to calibrate the analog LUT 24 based on the feedback signal 78. For a detailed description on specific embodiments of the calibration circuit 74, please refer to U.S. patent application Ser. No. 17/163,685, entitled "APPARATUS AND METHOD FOR CALIBRATING AN ENVELOPE TRACKING LOOKUP TABLE."

Figure 2:
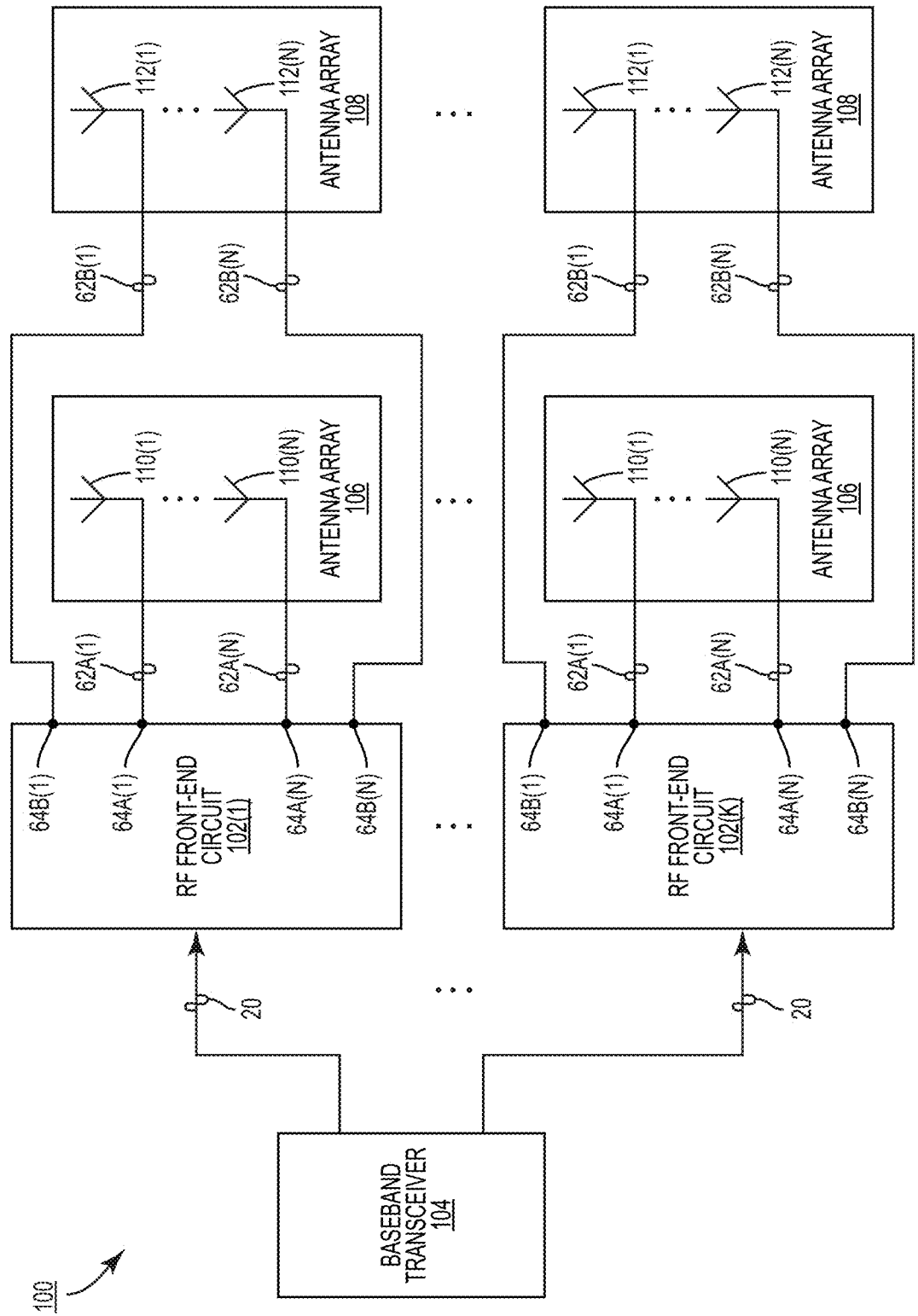
FIG. 2 is a schematic diagram of a wireless device including a number of RF front-end circuits of FIG. 1.

FIG. 2 is a schematic diagram of a wireless device 100 that includes a number of RF front-end circuits 102(1)-102(K), which can be the RF front-end circuit 10 of FIG. 1.

The wireless device 100 includes a baseband transceiver 104 that is separated from any of the RF front-end circuits 102(1)-102(K). The baseband transceiver 104 is configured the generate the input signal 20.

Each of the RF front-end circuits 102(1)-102(K) is coupled to a first antenna array 106 and a second antenna array 108. The first antenna array 106 includes a number of first antennas 110(1)-110(N), each coupled to a respective one of the antenna ports 64A(1)-64A(N) and configured to radiate a respective one of the RF signals 62A(1)-62A(N) in a first polarization (e.g., horizontal polarization). The second antenna array 108 includes a number of second antennas 112(1)-112(N), each coupled to a respective one of the second antenna ports 64B(1)-64B(N) and configured to radiate a respective one of the second RF signals 62B(1)-62B(N) in a second polarization (e.g., vertical polarization).

The RF front-end circuits 102(1)-102(K) may be disposed in different locations in the wireless device 100 to help enhance RF performance and improve user experience. For example, some of the RF front-end circuits 102(1)-102(K) may be provided on a top edge of the wireless device 100, while some of the ET RF front-end circuits 102(1)-102(K) are provided on a bottom edge of the wireless device 100.

While the above discussion focuses on an RF front end circuit 10 suitable for use in Fifth Generation (5G) cellular networks, the present disclosure is not so limited, and the present disclosure may be implemented in 3G, 4G, 5G networks, or the like. Of interest is the operation of the power amplifiers 18A(1)-18A(N) and power amplifiers 18B(1)-18B(N) and more particularly, the output stage amplifiers 68 and 72. It should be appreciated that while the power amplifiers are designed to be robust and operate over a wide spectrum of operating conditions, the power amplifiers are the product of design compromises, and, as a result, the power amplifiers may have an optimal operating region, a region where it is safe for the power amplifier to operate, and regions where the power amplifier may fail.

Figure 3:
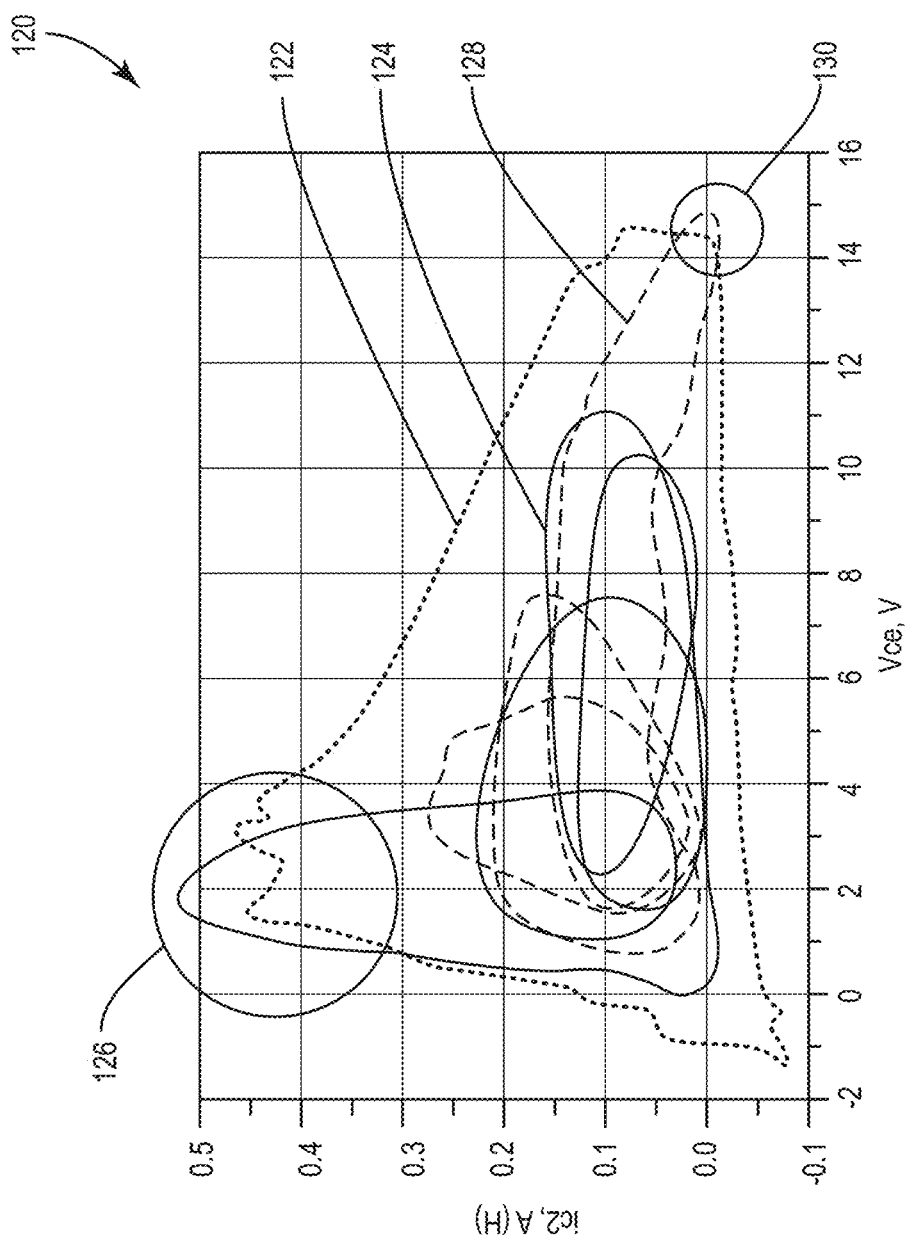
FIG. 3 is a current versus voltage diagram showing a safe region of operation and how excess current and/or excess voltage may push operation of a power amplifier outside the safe region of operation.

FIG. 3 illustrates a voltage versus current graph 120 with a safe region of operation marked by curve 122. As current fluctuates as illustrated by line 124, the current may exit the safe region of operation (sometimes referred to as safe-operating-area (SOA)) as denoted by region 126. Likewise, as voltage fluctuates, as illustrated by line 128, the voltage may exit the safe region of operation as denoted by region 130. Region 126 may be an overcurrent failure and region 130 may be an overvoltage failure.

Figure 4:
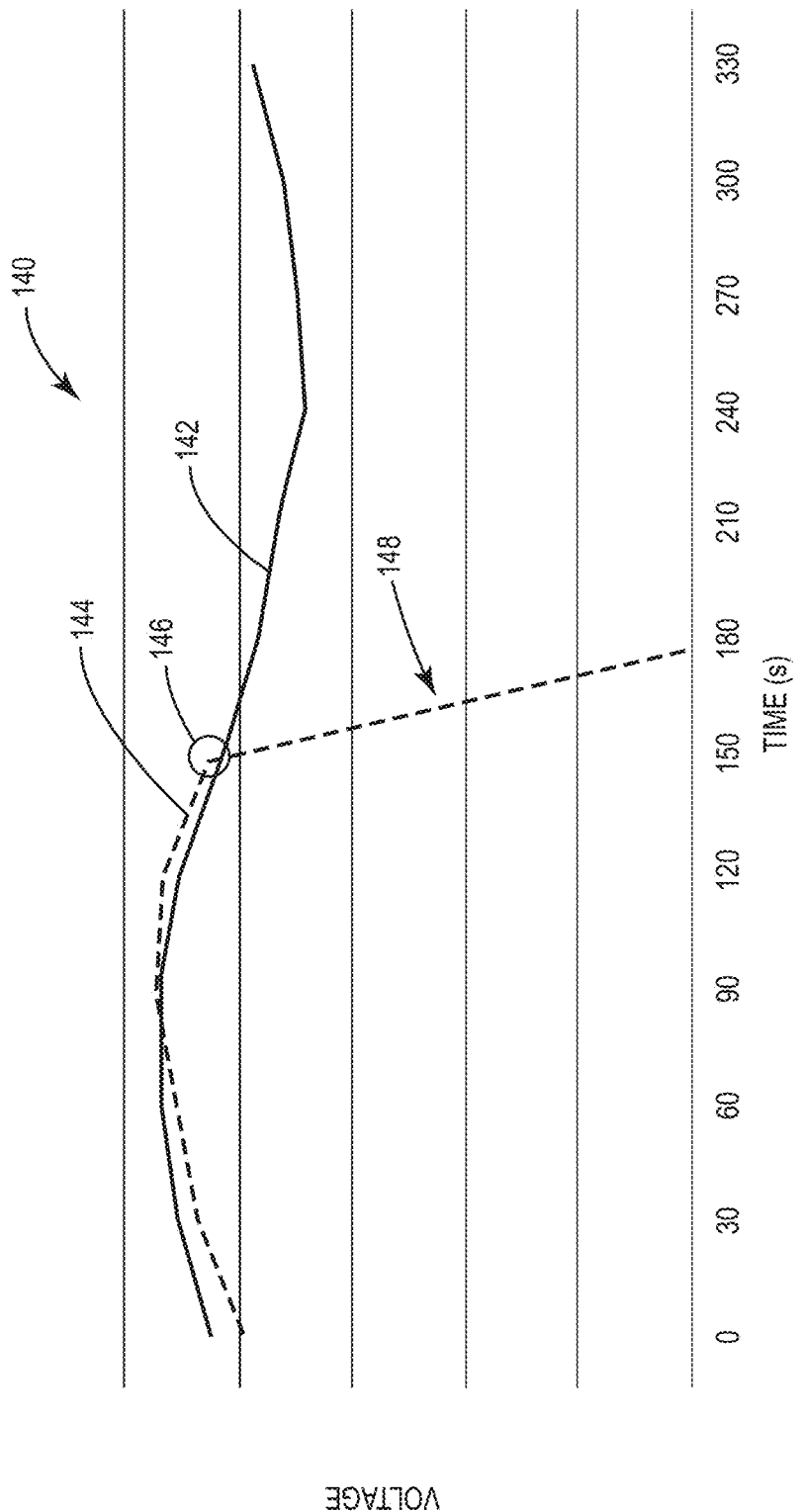
FIG. 4 is a time versus voltage standing wave ratio diagram showing the results of unprotected over-current conditions.

Again, while the power amplifiers are designed to be robust and continue operation at a wide range of operating conditions, it is possible to push the power amplifiers outside the safe region of operation and cause a failure. FIG. 4 provides a voltage versus time graph 140 where two amplifiers operate. A first amplifier, denoted by line 142, stays within a safe region of operation and continues to function. A second amplifier, denoted by line 144 has an overcurrent condition at time 146 and fails. After a sharp decline 148, operation does not continue for the second amplifier. Such failure can lead to performance degradation up to and including, complete loss of functionality (e.g., so called "bricking" the device). Perhaps cognizant that such failures may lead to an erosion of consumer confidence, manufacturers are prone to subject power amplifiers to myriad tests to verify that the power amplifiers are sufficiently rugged, including extreme Voltage Standing Wave Ratios (e.g., 10:1), large battery voltage levels (VBat) and Vcc voltages (e.g., +0.5 V higher than normal). Even without the need to satisfy such manufacturer ruggedness tests, there is a desire to provide power amplifiers that can withstand a variety of operating conditions with suitable worst-case margins.

Figure 5:
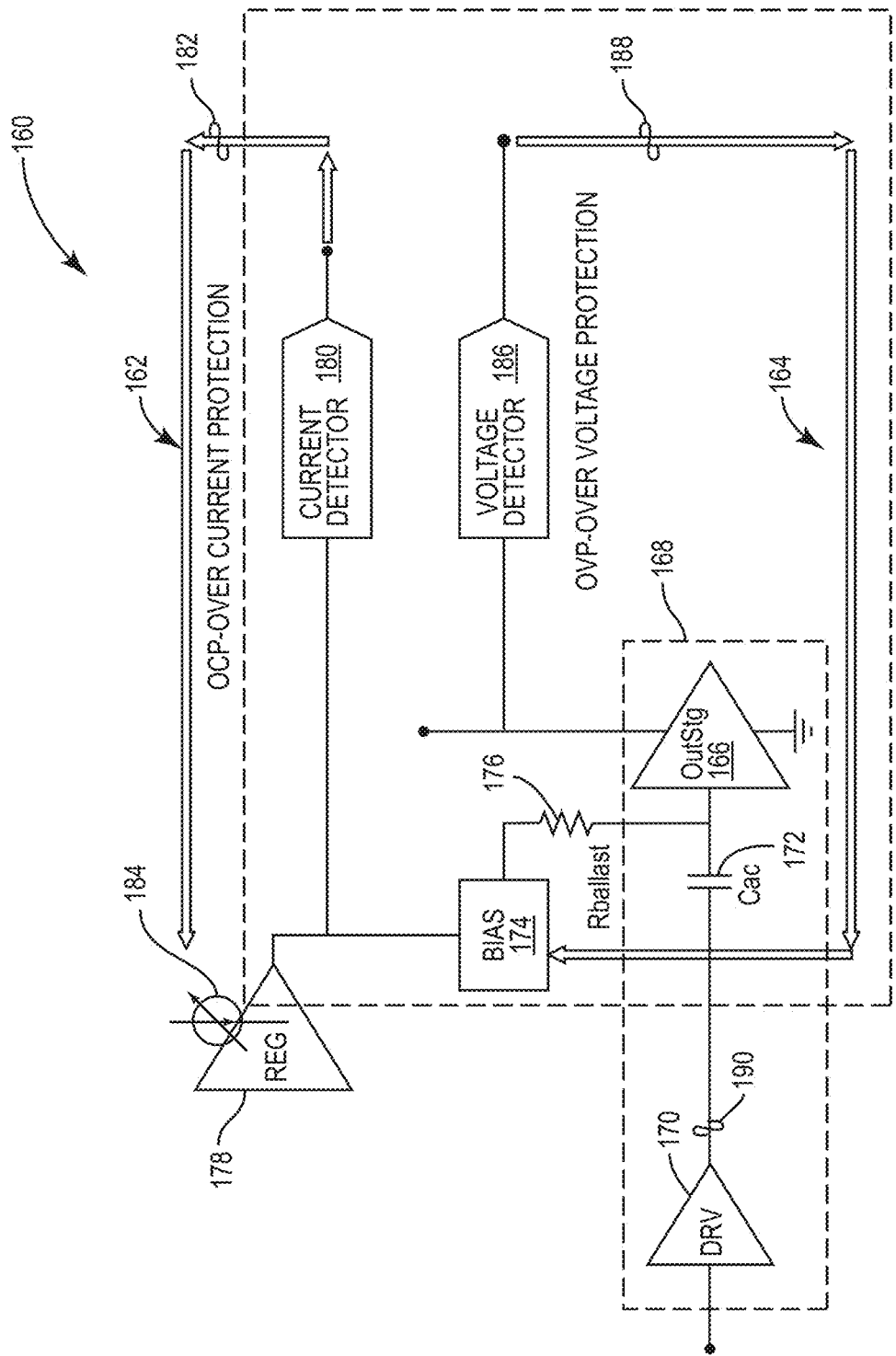
FIG. 5 is a block diagram of a conventional power amplifier circuit having overcurrent and overvoltage detector circuits that may cause ringing or fail to limit the overcurrent/overvoltage condition adequately.

FIG. 5 provides a block diagram of a power amplifier circuit 160 that employs conventional protection schemes to assist in meeting ruggedness tests. In particular, the power amplifier circuit 160 includes an overcurrent protection loop 162 and an overvoltage protection loop 164 that assist in preventing overcurrent and overvoltage conditions for an output stage 166 of a power amplifier 168. While not shown, the power amplifier 168 may be a multi-stage power amplifier such as illustrated in FIG. 1 for power amplifier 18A. Additionally, the power amplifier 168 may have a driver amplifier stage 170, which may (or may not) be considered part of the power amplifier 168. The driver amplifier stage 170 may be separated from the output stage 166 by a capacitor 172 that blocks direct current (DC) but passes alternating current (AC). The output stage 168 receives a bias signal from a bias circuit 174 through a resistor 176. The bias circuit 174 may be regulated by a bias regulator circuit 178.

With continued reference to FIG. 5, a current detector circuit 180 may sense a current provided from the bias regulator circuit 178 to the bias circuit 174 with the understanding that this detected current is a reasonable proxy for the current provided to the bias circuit 174 and thus also a reasonable proxy for the current output by the output stage 166. The current detector circuit 180 also provides a current protection signal 182 to an adjustable current source 184 associated with the bias regulator circuit 178 when a current level above a predetermined threshold is detected.

It should be appreciated that traditional GaAs power amplifiers have difficulty in implementing overcurrent protection loops compared with the voltages required by HBT devices for proper operation. That is, for example, direct Vcc collector current sensing is generally not advisable as negatively impacting the operation of the power amplifier. On the base side, there is generally not enough voltage headroom at the minimum supply voltage to allow including an additional HBT device for control. Furthermore, GaAs HBT processes cannot implement efficiently digital control circuits and adjustability for the protection loops.

With continued reference to FIG. 5, a voltage detection circuit 186 detects a voltage level associated with the output stage 166 and provides a voltage protection signal 188 to the bias circuit 174 when the detected voltage level exceeds a predefined threshold.

While the current detector circuit 180 and the voltage detection circuit 186 do help reduce or eliminate instances where the current and/or voltage exceed design tolerances, at least three limitations have been observed. First, the overcurrent protection signal 182 and the overvoltage protection signal 188 may operate against each other making adjustments in the bias regulator circuit 178 that cancel adjustments made in the bias circuit 174 or vice versa. As each circuit compensates for the other, the changes may induce a ringing in the output stage 166, where the ringing may negatively impact performance. Second, while the current and voltage limitations may be in place, the driver amplifier stage 170 may continue to drive the signal 190 at large values, which, in turn may cause the output stage 166 to exit the safe region of operation and result in failure or damage to the output stage. Third, many overvoltage protection circuits are implemented with diode stacks, which are typically require relatively large areas on the die since they need to hold the limiting current. Likewise, diode stacks provide just a static protection level that may not be reflective of the contours of the safe operating area.

Exemplary aspects of the present disclosure provide a variety of tools with which to manage operation of the power amplifier circuit. Specifically contemplated aspects include providing additional control to a driver amplifier stage, either through control of a bias or regulator circuit of the driver amplifier stage or through a clamp circuit on the connection between the driver amplifier stage and the output stage (e.g., thereby clamping signal 190). A further tool is linking the overvoltage protection signal to the overcurrent protection signal such that ringing is reduced or minimized. Still another tool is dynamic adjustment of an overvoltage condition based on the presence or absence of an overcurrent situation. That is, when an overcurrent situation occurs, it may take less voltage to induce failure. Accordingly, during overcurrent situations, the threshold for the overvoltage protection signal may be lowered.

It should be appreciated that while illustrated aspects focus on a GaAs BJT implementation, the present disclosure is not so limited. In exemplary aspects, the concepts of the present disclosure may be applied to amplifiers formed from GaAs, GaAN, SiGe, Si, or the like. Likewise, the amplifiers may use transistors that are BJTs, HBTs, FETs, or the like. In a particularly contemplated aspect, the power amplifier circuit may serve a hybrid RF path with a CMOS driver and a GaAs (either BJT or HBT) output stage. It should be appreciated that the concepts disclosed herein are applicable for any power amplifier configuration including, but not limited to: single-ended, differential, pseudo-differential, quadrature, Doherty, out-phasing, and the like. Further, while the description of FIGS. 1 and 2 reflect a 5G implementation, it should be appreciated that the concepts disclosed herein are applicable to 3G and/or 4G use cases and digital control circuitry (described in greater detail below) may allow switching between different protection limits when switching between the 3G, 4G, and 5G use cases when a single-mode transmission chain is used.

As noted above, direct current sensing may be inappropriate. Accordingly, in some implementations an indirect current sensing in the base of the device may be appropriate. Likewise, it is advantageous for an overcurrent protection loop to have devices with much lower control voltage levels (e.g., Vgs«Vbe) and also have digital circuits that can provide control and adjustability of the overcurrent protection loop settings. Accordingly, biasing the collector of the emitter follower from a dedicated regulator provides a path to sense and limit the collector current, which in turn will limit the base current of the output device.

Such regulators may be implemented in silicon processes (e.g., CMOS or BiCMOS). A digital to analog converter (DAC) can be used to adjust and program the current limiting value. However, such arrangement is not strictly required for all aspects of the present disclosure, but such will be used to illustrate an exemplary aspect of the present disclosure.

In this regard, FIG. 6 illustrates a power amplifier circuit 200 that includes an overcurrent protection loop 202 and an overvoltage protection loop 204 to assist in protecting a power amplifier 206 that includes an output stage 208. While not shown, the power amplifier 206 may be a multi-stage power amplifier such as illustrated in FIG. 1 for power amplifier 18A. Additionally, the power amplifier 206 may have a driver amplifier stage 210, which may (or may not) be considered part of the power amplifier 206. The driver amplifier stage 210 may be separated from the output stage 208 by a capacitor 212 that blocks direct current (DC) but passes alternating current (AC). The output stage 208 receives a bias signal from a bias circuit 214 through a resistor 216. The bias circuit 214 may be regulated by a bias regulator circuit 218.

With continued reference to FIG. 6, a current detector circuit 220 may sense a current provided from the bias regulator circuit 218 to the bias circuit 214 with the understanding that this detected current is a reasonable proxy for the current provided to the bias circuit 214 and thus also a reasonable proxy for the current output by the output stage 208. The current detector circuit 220 also provides a current protection signal 222 to an adjustable current source 224 associated with the bias regulator circuit 218 when a current level above a predetermined threshold is detected.

With continued reference to FIG. 6, a voltage detection circuit 226 detects a voltage level associated with the output stage 208 and provides a voltage protection signal 228 to the bias circuit 214 when the detected voltage level exceeds a predefined threshold.

To address one of the limitations of the system of FIG. 5, an auxiliary overcurrent protection loop 230 is added. The auxiliary overcurrent protection loop 230 provides a second overcurrent protection signal 232 in such a manner as to help limit the driver stage 210. As illustrated in FIG. 6 the second overcurrent protection signal 232 is provided to a driver regulator circuit 234. The driver regulator circuit 234 regulates the driver stage 210 much like the regulator circuit 218 regulates the output stage 208. Note that in an exemplary aspect, the regulator circuit 218 and the driver regulator circuit 234 are implemented in a CMOS die, while the bias circuit 214, output stage 208, and detector circuits 220, 226 are all implemented in a GaAs die. Further note that where the overcurrent protection loop 202 and the overvoltage protection loop 202 operate independently, the timing of the overcurrent protection loop 202 may be relatively fast compared to the timing of the overvoltage protection loop, such that quick changes are made through overcurrent protection and gradual changes are made through the overvoltage loop 204. By having this different timing, the likelihood of ringing is reduced.

To further reduce the likelihood of ringing, a power amplifier circuit 200' takes the additional step of linking via signal 236, the overvoltage protection signal 228 to the overcurrent protection signal 222 as illustrated in FIG. 7. In most other respects, the power amplifier circuit 200' is nearly identical to the power amplifier circuit 200 of FIG. 6. The net result of adding the overvoltage protection signal 236 to the overcurrent protection signal 222 is the resulting signal 222' which activates the regulator circuit 218 earlier than just those situations where there is high current. In an exemplary aspect, the overvoltage protection signal 236 alone exceeds the threshold sufficient to trigger overcurrent protection measures (e.g., limiting the regulator 224). The combined signal 222' also impacts signal 232' which controls the driver regulator circuit 234.

Instead of controlling a driver regulator circuit 234 as shown in FIG. 6 or 7, the second overcurrent protection signal 232 or 232' may instead control a driver bias circuit 240, which biases the driver stage 210 through a resistor 242 as shown in power amplifier circuit 200" in FIG. 8. It should be appreciated that the power amplifier circuit 200" may have linked loops 202 and 204 as in FIG. 7 or independent loops 202 and 204 as in FIG. 6.

Instead of controlling a driver regulator circuit 234 or a bias circuit 240 as shown in FIGS. 6-8, the second overcurrent protection signal 232 or 232' may instead control a clamp 250, which provides a limit on the output signal 252 of the driver stage 210 as shown in power amplifier circuit 200'" in FIG. 9. It should be appreciated that the power amplifier circuit 200" may have linked loops 202 and 204 as in FIG. 7 or independent loops 202 and 204 as in FIG. 6.

Instead of controlling the driver amplifier 210, it may be possible to provide additional control to the bias circuit 214 as shown in power amplifier circuit 200"" in FIG. 10. Specifically, the signal 232 lowers the bias voltage through the bias circuit 214. Since the bias circuit 214 receives signals from both the loop 202 and the loop 204, the loop 204 does not have to be linked to the loop 202 (although it can be).

As alluded to above, the present disclosure may be implemented across multiple dies and those dies may have different technology types. For example, as illustrated in FIG. 11, the power amplifier circuit 270 includes a first die 272 which may be a CMOS die with digital control circuitry and driver stages and a second die 274, which may be a GaAs die with relatively high power BJTs therein. More specifically, the first die 272 may include an RF input 276 that receives an RF signal 278. The RF signal 278 passes through an input match circuit 280 which may include a variable capacitor (Cin) 282 that receives, for example, a two-bit control word from a control circuit 284. The RF signal 278 is then passed to a CMOS driver stage 286. The CMOS driver stage 286 may receive a driver current (Idrv) from a current source 288 that receives, for example, a five-bit control word from the control circuit 284. A variable resistor (Rfb) 290 may be present and couple an input and an output of the CMOS driver stage 286 to provide a feedback loop for the driver stage 286. The variable resistor 290 may be controlled by, for example, a two-bit control word from the control circuit 284. The CMOS driver stage 286 may also receive a regulating signal from a voltage regulator circuit 292. While FIG. 11 suggests that the voltage regulator circuit 292 may be implemented in CMOS, it should be appreciated that there is an equivalent NMOS circuit reliant on Vcc (instead of Vbat) that may be implemented without departing from the present disclosure. The voltage regulator circuit 292 (analogous to regulator circuit 234 of FIG. 6) is controlled by the control circuit 284. The signal from the voltage regulator circuit 292 may also interact with a bias circuit 294 (analogous to bias circuit 240 in FIG. 8), which may also be controlled by the control circuit 284. Further, a regulator circuit 296 (analogous to regulator circuit 224 of FIG. 6) may be controlled by the control circuit 284. The control circuit 284 may generate the control words and control signals based on a signal 298 (analogous to signal 222, 222') from the second die 274.

With continued reference to FIG. 11, the second die 274 may include a bias circuit 300 with a plurality of BJTs 302(1)-302(N) therein, including mirrored BJTS 302(2) and 302(3). The second die 274 may further include an output stage 304 (analogous to 208) with a BJT 306 therein. Current sensor circuit 308 and voltage sensor circuit 310 may provide overcurrent protection signals 298 and overvoltage protection signal 312. While this arrangement is specifically contemplated, other arrangements may be made without departing from the present disclosure. For example, sensors (Vbat, Vcc, or the like) may be included in the first die 272.

While the examples described above are good at detecting and preventing overcurrent and overvoltage conditions, the two events do not exist in isolation. Thus, part of the advantage of linking the overvoltage loop to the overcurrent loop is that detecting an overvoltage condition automatically begins controlling current. However, merely controlling current and voltage may not be enough to avoid failure. For example, as illustrated by graph 320 in FIG. 12, where there is a current threshold of 0.4 A (line 322) and a voltage threshold of 14 V (line 324), current 326 may be clipped at region 328 and voltage may be clipped at region 330, such clipping may cause a shift 332 resulting in activity in region 334, which is outside the safe region of operation 336 and may lead to failure of the power amplifier even though both current and voltage are below the corresponding thresholds.

Exemplary aspects of the present disclosure provide a solution to the shift 332 by allowing for the voltage threshold to be changed dynamically based on the presence of an overcurrent condition. For example, using the control circuit 284 of FIG. 11, the voltage threshold for signal 312 may be adjusted such that overvoltage protective measures are engaged at much lower voltage levels and thus protect the output stage against the failure of region 334. Further, the threshold may change based on cellular standard being used (e.g., 3G, 4G, and 5G may all have different base thresholds and all have different adjusted thresholds). Further the amount of adjustment to the voltage threshold may vary by how much overcurrent is present.

FIG. 13 illustrates the dynamic threshold in graph 320' where the adjusted voltage threshold 324' curtails the current and voltage as noted in region 334' (contrasted with region 334 of FIG. 12).

FIG. 14 provides a block diagram of an exemplary aspect of how such dynamic voltage thresholds may be implemented. Many of the elements of a power amplifier circuit 350 are identical to those already discussed. However, in power amplifier circuit 350, the voltage detector 226 provides a signal 352 to a comparator circuit 354. The comparator circuit 354 generates an overvoltage protection signal 356 when the detected voltage from signal 352 exceeds a reference voltage (i.e., the threshold) received via a signal 358 from a bandgap circuit 360. The bandgap circuit 360 is set by a regulator 362, which in turn is coupled to a current limit circuit 364. When the current limit circuit 364 is activated by the current detector 220, the current limit circuit 364 sends a signal 366 to the regulator circuit 362 that causes the regulator circuit 362 to modify the bandgap circuit 360.

One simple way to implement the dynamic voltage threshold is using a current injected in a resistor placed in series with one or more diode connected devices. Lowering such threshold level can be achieved by modulating the value of the injected current. The output of the overvoltage protection loop can be a current that is injected into the bias circuit 214, resulting in a lowering of the bias voltage applied to the output stage 208.

While various circuits can be used, FIG. 15 provides exemplary circuits for the bias circuit 214" and the bandgap circuit 360. Specifically, the bias circuit 214" may include transistors 380, 382, and 384, with transistors 382 and 384 being mirrored. Resistors 386 and 388 are placed in series between the transistor 380 and the transistors 382, 384. The bandgap circuit 360 may be a variable current source 390 with a series resistor 392 coupled to ground.

FIG. 16 provides still another possible implementation in power amplifier circuit 400 where the voltage detector 226 includes a diode 402 and a capacitor 404. The voltage detector 226 also includes stacked transistors 406(1)-406(N) and stacked transistors 408(1)-408(M), where in FIG. 16, N=3, M=2. The collector of the transistor 408(M) generates signal 352. The bias circuit 214''' is similar to the bias circuit 214" but includes further resistors and capacitors.

While the description above provides a nice solution to overcurrent and overvoltage situations, it is possible that neither threshold has been exceeded, but the overall power of the power amplifier is outside the safe region of operation. Such region may be reached even without triggering the voltage adjustment threshold of FIG. 13. For example, as illustrated by graph 500 in FIG. 17. As previously discussed, there may be overcurrent conditions 502 where the current is greater than what keeps operation in the SOA 504. Likewise, there may be overvoltage conditions 506 where the voltage is greater than what keeps operation in the SOA 504. However, even if current limit 508 and voltage limit 510 are provided to indicate overcurrent and overvoltage conditions respectively, there may be operation under the limits 508, 510, but outside the SOA 504. For example, region 512 may have current and voltage at values less than the limits 508, 510, but outside the SOA 504. Sustained operation in region 512 may lead to failure of the power amplifier.

Exemplary aspects of the present disclosure provide two additional overcondition protection loops that help reduce the chance that a power amplifier will operate outside the SOA. In particular, exemplary aspects of the present disclosure provide an overpower protection loop that limits total power (a function of both current and voltage) produced by the power amplifier as well as an overtemperature protection loop that may throttle operation when the power amplifier exceeds a temperature threshold, thereby preventing damage to the power amplifier that might result from extended operation at elevated temperatures.

In this regard, FIG. 18 shows a power amplifier circuit 520 that includes an overcurrent protection loop 522 and an overvoltage protection loop 524 to assist in protecting the power amplifier 206 that includes the output stage 208. The output stage 208 receives a bias signal from the bias circuit 214 through the resistor 216. The bias circuit 214 may be regulated by a bias regulator circuit 218.

With continued reference to FIG. 18, the current detector circuit 220 may sense a current provided from the bias regulator circuit 218 to the bias circuit 214 with the understanding that this detected current is a reasonable proxy for the current provided to the bias circuit 214 and thus also a reasonable proxy for the current output by the output stage 208. The current detector circuit 220 also provides the current protection signal 222 to the adjustable current source 224 associated with the bias regulator circuit 218 when a current level above a predetermined threshold is detected.

With continued reference to FIG. 18, the voltage detection circuit 226 detects a voltage level associated with the output stage 208 and provides the voltage protection signal 228 to the bias circuit 214 when the detected voltage level exceeds a predefined threshold. Up until this point, the power amplifier circuit 520 is similar to the power amplifier circuit 200 of FIG. 6. The power amplifier circuit 520 also includes an overpower protection loop 526 that includes a power detector circuit 528 that generates a power protection signal 530 that is provided to the bias circuit 214. Details on exemplary versions of the power detector circuit 528 are provided below with reference to FIGS. 20A-20C and 21. The power detector circuit 528 may compare a sensed power from the power amplifier 206 to a threshold and generate the signal 530, which in turns adjusts the bias signal provided to the power amplifier 206 through the resistor 216.

Note that where the overcondition loops 522, 524, and 526 are effectively independent of one another, there may be ringing or other stability issues as discussed above with reference to FIG. 6, but further complicated by the additional signal 530 potentially competing with signals 222, 228. One way to mitigate this potential stability issue is to subordinate the overpower protection loop to the overcurrent protection loop as shown by power amplifier circuit 540 in FIG. 19. The power amplifier circuit 540 is arranged so that the signal 530 from the power detector circuit 528 is provided to the output of the current detector circuit 220 and summed with the signal 222 to form signal 222", which is provided to the regulator circuit 218. In this arrangement, when overpower conditions are detected, the signal 530 added to the signal 222 causes the regulator circuit 218 to adjust the bias circuit 214 to throttle the power amplifier 206 that much earlier.

FIGS. 20A-20C illustrate exemplary possible power detector circuits 528A-528C, any of which may be used for the power detector circuit 528 of FIG. 18 or 19. In FIG. 20A, a power detector circuit 528A (FIG. 20A) may directly sense voltage at the collector (Vcollector) and indirectly sense current at the collector (Icollector). A multiplier 550A may multiple voltage by current to determine Power. In contrast, a power detector circuit 582B (FIG. 20B) may sense the voltage at the collector (Vcollector) and the voltage at the base (Vbase) and a multiplier 550B multiply these two values (and potentially account for a resistance) to determine power since $V^2R$ is also a power formula under Ohm's Law. Still another power detector circuit 528C is illustrated in FIG. 20C. The power detector circuit 528 senses voltage at the collector (Vcollector) and the voltage at the base (Vbase) and uses an overlap detector circuit 552 to determine where the signals overlap and what the sum of the overlap is. The sum of the overlap may act as a proxy for the power and may be used to generate the power protection signal 530.

While the power detector circuits 528A-528C are all possible, direct voltage and current multipliers are not easy to implement using analog techniques. Further GaAs HBT processes may not have easy access to mixed signal techniques and digital calibration solutions. Accordingly, a power detector circuit 528D is illustrated in FIG. 21 and may act as the power detector circuit 528 of FIG. 18 or 19.

In this regard, the power detector circuit 528D may sense an approximate collector voltage through a capacitor 554 and resistor 556 and an approximate base current through a resistor 558. A mixer 560, which may be a BJT, receives the two signals from the resistors 556, 558 at the base of the BJT, and the collector of the mixer 560 provides the overpower signal 530. Alternatively, instead of a mixer 560, an XOR circuit (not shown) may be used. The overpower signal 530 may be compared to a reference level and a control signal generated to drive the amplifier bias in the direction of de-biasing when an overpower condition is detected. Where the signal 530 is added to the signal 222, the previously described for the regulator 218 is readily used.

There may be occasions where sustained use does not trigger overcurrent, overvoltage, or overpower conditions, but does generate substantial heat that is unable to be dissipated at the rate of heat generation. It should be appreciated that heat may damage the power amplifier as readily as overcurrent, overvoltage, or overpower conditions. Thus, being able to throttle operation based on overtemperature conditions is also desirable so as to avoid loss of functionality.

There are a variety of ways in which temperature detection may occur. For example, as illustrated by die 570 in FIG. 22A, a sensor 572 may be placed in or contiguous to a power cell 574 that may contain the power amplifier 208, and which are generally generating heat as the power amplifier 208 is used. A second sensor 576 may be placed outside the power cell 574 and removed therefrom in a generally cool portion of the die 570. Signals from the sensors 572, 576 may be provided to a comparator 578. Because the die 570 is relatively cool, the comparator 578 is likely to provide an indication of a large difference between the signals from the two sensors 572, 576. Alternatively, the sensor 576 may be replaced by a temperature independent reference signal. The same comparison may be made to generate a difference value indicative of temperature at the power cell 574. More detail on such a replacement is provided below with reference to FIG. 22B.

In this regard, FIG. 22B illustrates an alternate sensor 576' which provides a reference signal that is temperature independent through a bandgap reference circuit 700. Specifically, the bandgap reference circuit 700 generates a voltage Vbg that is provided to a scaling factor circuit 702 to provide a reference voltage Vref to the comparator 578. More information about a possible scaling factor circuit 702 is provided with reference to FIG. 22C.

In this regard, FIG. 22C illustrates a scaling factor circuit 702 that uses a resistor divider to scale the voltage Vbg. Specifically, a first resistor 704 is coupled to a current source Ibg 706 controlled by the voltage Vbg. A second resistor 708 is serially coupled to the first resistor 704. A node 710 exists between the first resistor 704 and the second resistor 708 and may be coupled to a bipolar sensor transistor 712 (or a diode (not shown)). A sensor transistor 712 may be a BJT (shown) or a FET (not shown). The ratio of resistance for the first resistor 704 and the second resistor 708 dictates the reference voltage Vref generated at the node 710. The sensor transistor 712 acts as the comparator 578 and generates the overtemperature control signal. An additional variation on this theme is presented below with reference to FIG. 29.

More likely, the die is going to warm as various circuits are use and heat dissipates through the die. In such instances, the differences in the signals between the sensors 572 and 576 is likely to be small, which might not properly indicate a dangerous heat condition.

Accordingly, it may be appropriate to find the temperature difference while considering an absolute temperature, as illustrated by die 580 in FIG. 23. The die 580 may have a similar first sensor 582 in or contiguous to the power cells 584 where the power amplifier 208 is used. A second sensor 586 may be placed outside the power cell 584 and removed therefrom, but perhaps in a warm portion of the die 580. Signals from the sensors 582, 586 may be provided to a comparator 588. Additionally, a proportional to absolute temperature (PTAT) circuit 590 may provide a signal to the comparator 588 so that dangerous heat conditions may be detected even if there are only small differences between the signals because the overall die 580 is warm.

When placed into a power amplifier circuit 600 as illustrated in FIG. 24, the overtemperature protection loop 602 may be integrated with an overcurrent protection loop 604 (analogous to loop 202 of FIG. 6). However, a difference circuit 606 may be used to subtract the signal from the second sensor 586 from the signal from the first sensor 582 and have that difference compared to a threshold signal as informed by the PTAT circuit 590.

An alternate die 610 is illustrated in FIG. 25 with more detail about the sensors 582, 586, which may be BJTs.

Note that as with other overcondition loops, the overtemperature loop may be subordinated to the overcurrent loop as illustrated in FIG. 26. While the overvoltage loop 204 is illustrated as independent, it may also be subordinated to the overcurrent loop.

Note further that all four overcondition loops described herein may be present and associated with a power amplifier 208 as illustrated in FIG. 27. Again, note that while the overvoltage loop 204 is illustrated as independent, it may also be subordinated to the overcurrent loop.

It is also possible, as illustrated in FIG. 28, that the overtemperature loop may operate independently of the overcurrent loop.

FIG. 29 illustrates an overtemperature protection loop 800 that works with a Darlington configuration circuit 804 for the overtemperature sensor. Specifically, the bandgap reference circuit 700 provides the voltage Vbg signal to the current source Ibg 706, which in turn drives the divider circuit formed from the resistors 704, 708. A node 710' between the resistors 704, 708 is also coupled to a capacitor 802 to provide an independent voltage reference to assist in scaling. The node 710' is also coupled to the Darlington configuration circuit 804 formed from transistors 806 and 808 and a resistor 810. A limiting resistor 812 is present at an output 814 to provide the otp control signal.

Those skilled in the art will recognize improvements and modifications to the preferred embodiments of the present disclosure. All such improvements and modifications are considered within the scope of the concepts disclosed herein and the claims that follow.

What is claimed is:
1. A power amplifier circuit, comprising:
  a power amplifier comprising a bipolar junction-based output stage configured to provide an amplified output signal;

a bipolar junction-based bias circuit;
an overvoltage protection circuit coupled to the output stage and configured to provide an overvoltage signal to the bipolar junction-based bias circuit; and
a power detector circuit separate and distinct from the overvoltage protection circuit, the power detector circuit coupled to the power amplifier and configured to provide an overpower protection signal to the bipolar junction-based bias circuit, wherein the bipolar junction-based bias circuit is configured
to control a bias signal for the output stage based on the overpower protection signal.

2. The power amplifier circuit of claim 1, wherein the bipolar junction-based bias circuit is coupled to the output stage through a resistor.

3. The power amplifier circuit of claim 1, further comprising a regulator circuit configured to control the bipolar junction-based bias circuit.

4. The power amplifier circuit of claim 1, further comprising a current detector circuit coupled to the power amplifier and configured to provide an overcurrent protection signal to a bias regulator circuit configured to control the bipolar junction-based bias circuit for the output stage based on the overcurrent protection signal.

5. The power amplifier of claim 4, further comprising a node configured to couple to the power detector circuit and the current detector circuit such that the overpower protection signal and the overcurrent protection signal are summed.

6. The power amplifier circuit of claim 2 wherein the bipolar junction-based bias circuit comprises a mirrored pair of transistors and wherein at least one of the pair of transistors comprises an emitter configured to bias the output stage.

7. The power amplifier circuit of claim 1, wherein the power detector circuit comprises:
a first path coupled to a collector of the output stage;
a second path coupled to a base of the output stage; and
a mixer coupled to the first path and the second path.

8. The power amplifier circuit of claim 7, wherein the mixer comprises a bipolar junction transistor comprising a base and a collector wherein the mixer is coupled to the first path and the second path at the base and wherein the overpower protection signal is provided at the collector.

9. The power amplifier circuit of claim 1, further comprising an overtemperature detection circuit configured to provide an overtemperature protection signal to the circuit.

10. The power amplifier circuit of claim 9, wherein the overtemperature detection circuit comprises:
a reference device temperature sensor positioned remotely from the output stage;
a power device temperature sensor proximate the output stage;
a difference circuit coupled to the reference device temperature sensor and the power device temperature sensor;
a comparator; and
a proportional temperature-to-absolute temperature circuit coupled to the comparator.

11. The power amplifier circuit of claim 10, wherein the comparator is configured to provide the overtemperature protection signal.

12. The power amplifier circuit of claim 10, further comprising a node coupled to the power detector circuit and the overtemperature detection circuit such that the overpower protection signal and the overtemperature protection signal are summed.

13. The power amplifier circuit of claim 1, wherein the power amplifier comprises at least an input stage coupled to the output stage.

14. The power amplifier circuit of claim 13, wherein the power amplifier comprises a middle stage positioned between the input stage and the output stage.

15. The power amplifier circuit of claim 1, further comprising a complementary metal oxide semiconductor (CMOS) driver coupled to the power amplifier.

16. The power amplifier circuit of claim 1, further comprising an overcurrent protection circuit coupled to the output stage and configured to provide an overcurrent protection signal to the bias circuit.

17. The power amplifier circuit of claim 16, further comprising an overtemperature protection circuit coupled to the output stage and configured to provide an overtemperature protection signal to the bias circuit.

* * * * *

UNITED STATES PATENT AND TRADEMARK OFFICE
CERTIFICATE OF CORRECTION

| | | |
|---|---|---|
| PATENT NO. | : 12,155,353 B2 | Page 1 of 1 |
| APPLICATION NO. | : 17/488877 | |
| DATED | : November 26, 2024 | |
| INVENTOR(S) | : Baker Scott et al. | |

It is certified that error appears in the above-identified patent and that said Letters Patent is hereby corrected as shown below:

In the Specification

In Column 5, Line 52, replace "nodes $N_{A1\text{-}1}$–$NA_{1\text{-}N}$" with --nodes $N_{A1\text{-}1}$–$N_{A1\text{-}N}$--.

Signed and Sealed this
Thirty-first Day of December, 2024

Derrick Brent
*Acting Director of the United States Patent and Trademark Office*